US010666169B2

(12) United States Patent
Furukawa

(10) Patent No.: US 10,666,169 B2
(45) Date of Patent: May 26, 2020

(54) CONTROL DEVICE FOR AC ROTARY MACHINE AND CONTROL DEVICE FOR ELECTRIC POWER STEERING

(71) Applicant: Mitsubishi Electric Corporation, Tokyo (JP)

(72) Inventor: Akira Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 294 days.

(21) Appl. No.: 15/549,811

(22) PCT Filed: Mar. 12, 2015

(86) PCT No.: PCT/JP2015/057313
§ 371 (c)(1),
(2) Date: Aug. 9, 2017

(87) PCT Pub. No.: WO2016/143121
PCT Pub. Date: Sep. 15, 2016

(65) Prior Publication Data
US 2018/0022378 A1  Jan. 25, 2018

(51) Int. Cl.
*H02P 6/10* (2006.01)
*H02P 23/00* (2016.01)
(Continued)

(52) U.S. Cl.
CPC ............... *H02P 6/10* (2013.01); *B62D 5/046* (2013.01); *G01R 17/04* (2013.01);
(Continued)

(58) Field of Classification Search
CPC .... H02P 6/08; H02P 6/10; H02P 21/22; H02P 25/024; H02P 23/0004; H02P 27/08; B62D 5/046; G01R 17/04; G01R 19/0053
(Continued)

(56) References Cited

U.S. PATENT DOCUMENTS

2005/0125124 A1* 6/2005 Nagase ................ H02P 21/04
701/41
2009/0052215 A1  2/2009 Watanabe
(Continued)

FOREIGN PATENT DOCUMENTS

EP     1265351 A2   12/2002
EP   2 405 568 A1    1/2012
(Continued)

OTHER PUBLICATIONS

Ri; Translation of JP 2011067023 "Current Detection Method, Inverter Device and Converter Device Utilizing Current Detection Method, Motor Drive Equipped With Such Device, and Refrigeration and Air-Conditioning Equipment"; Mar. 2011; EPO & Google (Year: 2011).*

(Continued)

*Primary Examiner* — Daniel R Miller
*Assistant Examiner* — Rahul Maini
(74) *Attorney, Agent, or Firm* — Sughrue Mion, PLLC; Richard C. Turner

(57) ABSTRACT

A control device for an AC rotary machine includes an AC rotary machine having m sets of n-phase windings, a current detector, a power converter, and a control unit that calculates voltage commands on the basis of respective differences between a current command for the AC rotary machine and current detection values obtained by the current detector, and outputs ON/OFF signals to high potential side switching elements and low potential side switching elements of the power converter by comparing applied voltages calculated on the basis of the voltage commands with a carrier wave signal, wherein the current detector, when detecting currents flowing through the n-phase windings on the basis of currents flowing through current detection resistance elements that are inserted in series into the low potential side
(Continued)

switching elements, obtains current detection values at two or more fixed timings over a single period of the carrier wave signal.

9 Claims, 26 Drawing Sheets

(51) Int. Cl.
    *B62D 5/04*     (2006.01)
    *H02P 21/22*     (2016.01)
    *H02P 27/08*     (2006.01)
    *H02P 25/024*     (2016.01)
    *G01R 17/04*     (2006.01)
    *G01R 19/00*     (2006.01)

(52) U.S. Cl.
    CPC .......... *G01R 19/0053* (2013.01); *H02P 21/22* (2016.02); *H02P 23/0004* (2013.01); *H02P 25/024* (2016.02); *H02P 27/08* (2013.01)

(58) Field of Classification Search
    USPC ....................................................... 324/76.77
    See application file for complete search history.

(56) References Cited

U.S. PATENT DOCUMENTS

| | | |
|---|---|---|
| 2013/0264974 A1 | 10/2013 | Suzuki |
| 2014/0253009 A1 | 9/2014 | Kimpara et al. |

FOREIGN PATENT DOCUMENTS

| | | | | |
|---|---|---|---|---|
| JP | 11-004594 A | | 1/1999 | |
| JP | 2002-199742 A | | 7/2002 | |
| JP | 2005-237172 A | | 9/2005 | |
| JP | 2011067023 A | * | 3/2011 | .............. H02P 23/00 |
| JP | 2012-151998 A | | 8/2012 | |
| JP | 5161985 B2 | | 3/2013 | |
| JP | 2013-153619 A | | 8/2013 | |
| JP | 2013-219905 A | | 10/2013 | |
| JP | 5396948 B2 | | 1/2014 | |
| JP | 2014011944 A | | 1/2014 | |
| JP | 2015-019480 A | | 1/2015 | |
| WO | 2010103565 A1 | | 9/2010 | |

OTHER PUBLICATIONS

Communication dated Oct. 19, 2018 from the European Patent Office in counterpart application No. 15884611.3.
International Search Report of PCT/JP2015/057313, dated Jun. 16, 2015. [PCT/ISA/210].

* cited by examiner

CONTROL DEVICE FOR AC ROTARY MACHINE AND CONTROL DEVICE FOR ELECTRIC POWER STEERING

CROSS REFERENCE TO RELATED APPLICATIONS

This application is a National Stage of International Application No. PCT/JP2015/057313 filed Mar. 12, 2015, the contents of all of which are incorporated herein by reference in their entirety.

TECHNICAL FIELD

This invention relates to a control device for an AC rotary machine and a control device for an electric power steering with which an improvement in current detection precision is realized.

BACKGROUND ART

In a conventional motor control device, a duty of a current undetectable phase is fixed at 100% to prevent switching noise generated in a maximum phase where current detection is impossible from hindering current detection performed in relation to two phases other than the undetectable phase. Further, in this conventional motor control device, the phase current value of the undetectable phase is estimated on the basis of the phase current values of the two phases other than the undetectable phase (see PTL 1, for example).

Further, in a conventional frequency converter for an AC motor, a current detection zone is secured by adjusting an ON timing of a PWM pulse to the first half of a single PWM period, while a PWM output width is adjusted to the second half (see PTL 2, for example). By performing these adjustments, current detection precision and output can both be secured.

CITATION LIST

Patent Literature

[PTL 1] Japanese Patent No. 5396948
[PTL 2] Japanese Patent Application Publication No. H11-4594
[PTL 3] Japanese Patent No. 5161985
[PTL 4] Japanese Patent No. 5178768

SUMMARY OF INVENTION

Technical Problem

However, the prior art has the following problems.

In the motor control device according to PTL 1, in a case where an ON time of a low potential side switching element of the maximum phase is set to be shorter than a phase current detection time ts in order to secure the phase current detection time ts, switching noise is prevented from becoming intermixed in the phase current values of the two phases other than the maximum phase by keeping a high potential side switching element ON and keeping the low potential side switching element OFF.

According to FIG. 4 of PTL 1, to secure the phase current detection time ts, phase current detection must be implemented ts/2 after the center of a single carrier period. When Dth is set at 90% and a modulation factor is no higher than 100%, for example, noise can be prevented from becoming intermixed by employing the configuration of PTL 1.

In a region where the modulation factor exceeds 90%, however, the ON time of the high potential side switching element exceeds the ON time of the low potential side switching element. As a result, unevenness occurs in a heat generation condition. Further, during use in a condition where the modulation factor exceeds 100%, the duty of an intermediate phase exceeds Dth. As a result, the current detection precision deteriorates due to the effect of switching noise generated in the intermediate phase at the current detection timing.

Further, in the frequency converter for an AC motor according to PTL 2, the currents of two of the three phases can be detected without being affected by switching noise, and therefore the current detection precision is favorable. When the PWM output shifts before and after, however, a voltage harmonic is generated. In a control subject that is sensitive to sound vibration, noise or vibration is generated as a result of the voltage harmonic, leading to a deterioration in performance.

This invention has been designed to solve the problem described above, and an object thereof is to obtain a control device for an AC rotary machine and a control device for an electric power steering in which a deterioration in current detection precision due to the effect of switching noise in another phase does not occur.

Solution to Problem

A control device for an AC rotary machine according to this invention includes: a DC power supply that outputs a DC voltage; an AC rotary machine having m sets of n-phase windings, where m is a natural number and n is a natural number no smaller than 3; a current detector that detects respective current values of the m sets of n-phase windings; a power converter that includes high potential side switching elements and low potential side switching elements, converts the DC voltage into an AC voltage in response to switching control implemented on the high potential side switching elements and the low potential side switching elements on the basis of ON/OFF signals, and applies the AC voltage to the windings; and a control unit that calculates voltage commands on the basis of respective differences between a current command for the AC rotary machine and current detection values obtained by the current detector, and outputs the ON/OFF signals to the high potential side switching elements and the low potential side switching elements of the power converter by comparing applied voltages calculated on the basis of the voltage commands with a carrier wave signal, wherein the current detector, when detecting currents flowing through the n-phase windings on the basis of currents flowing through current detection resistance elements that are inserted in series into the low potential side switching elements provided in the power converter for at least (n−1) phases, detects the currents at two or more fixed timings over a single period of the carrier wave signal to obtain current detection values that do not include errors caused by switching noise.

Advantageous Effects of Invention

According to this invention, currents can be detected at two or more fixed timings over a single period of the carrier wave signal even with a conventional modulation method in which only a detected current that includes an error caused by the effect of switching noise can be obtained at a single current detection timing, and therefore current detection can be realized so as not to include errors caused by switching noise. As a result, it is possible to obtain a control device for an AC rotary machine and a control device for an electric power steering in which a deterioration in current detection precision due to the effect of switching noise in another phase does not occur.

DESCRIPTION OF EMBODIMENTS

Figure 1:
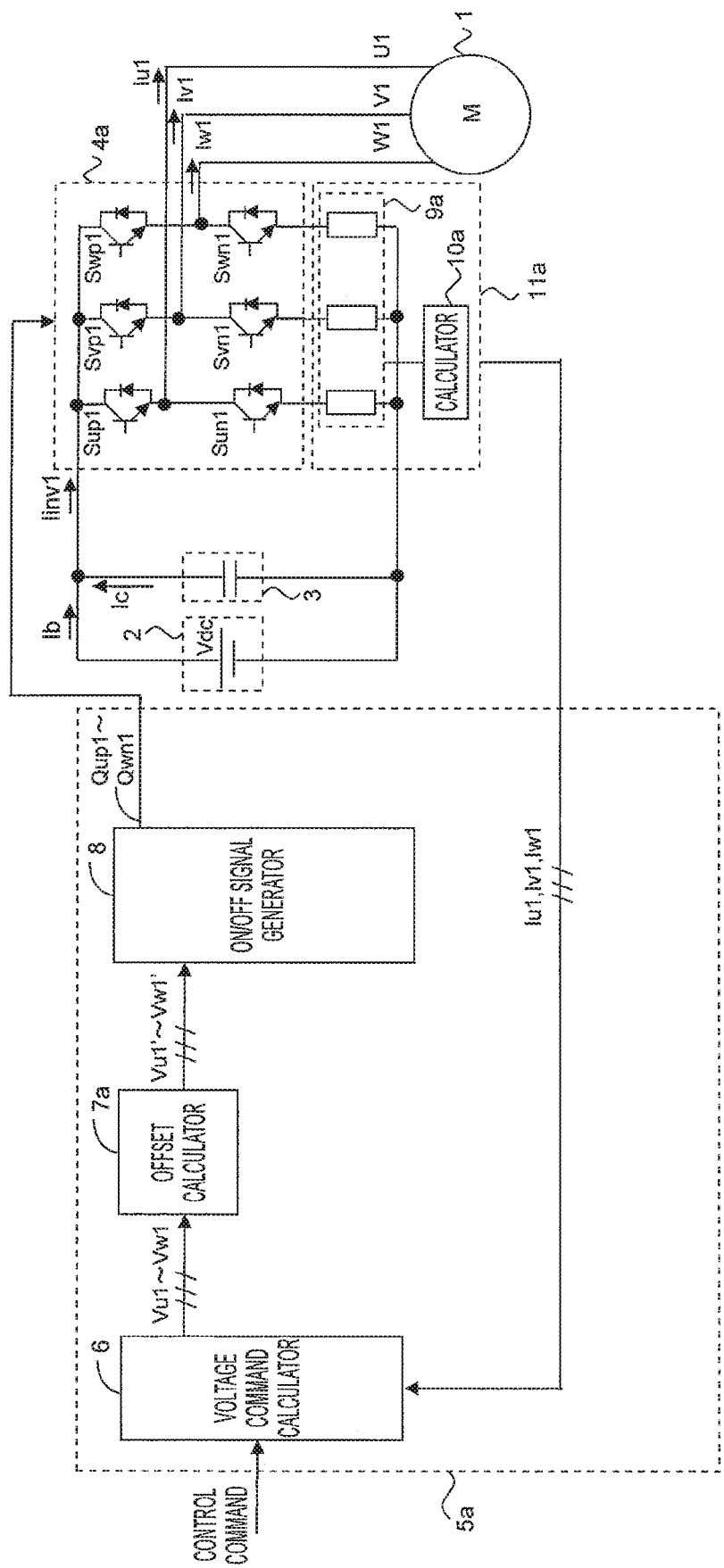
FIG. 1 is a view showing an overall configuration of a power conversion device according to a first embodiment of this invention.

Preferred embodiments of a control device for an AC rotary machine and a control device for an electric power steering according to this invention will be described below using the drawings. Note that identical or corresponding members and sites in the drawings will be described using identical reference numerals.

First Embodiment

FIG. 1 is a view showing an overall configuration of a power conversion device according to a first embodiment of this invention. An AC rotary machine 1 is a three-phase AC rotary machine in which three-phase windings U1, V1, W1 are housed in a stator of the rotary machine. A permanent magnet synchronous rotary machine, an induction rotary machine, a synchronous reluctance rotary machine, and so on may be cited as examples of this type of three-phase AC rotary machine, and in this invention, any AC rotary machine having three-phase windings may be used.

A DC power supply 2 outputs a DC voltage Vdc to a power converter 4a. Any device that outputs a DC voltage, such as a battery, a DC-DC converter, a diode rectifier, or a PWM rectifier, may be used as the DC power supply 2.

A smoothing capacitor 3 is connected in parallel to the DC power supply 2 in order to suppress variation in a bus current and thereby realize a stable direct current. Here, although not shown in detail in the drawings, equivalent series resistance Rc and lead inductance Lc exist in addition to true capacitor capacitance C.

The power converter 4a uses an inverter circuit, or in other words an inverter, to switch high potential side switching elements Sup1, Svp1, Swp1 and low potential side switching elements Sun1, Svn1, Swn1 ON and OFF on the basis of ON/OFF signals Qup1, Qun1, Qvp1, Qvn1, Qwp1, Qwn1. By switching the switching elements in this manner, the power converter 4a power-converts the DC voltage Vdc input from the DC power supply 2, and applies the resulting voltage to the three-phase windings U1, V1, W1 of the AC rotary machine 1. As a result, currents Iu1, Iv1, Iw1 are passed through the AC rotary machine 1.

Here, the ON/OFF signals Qup1, Qun1, Qvp1, Qvn1, Qwp1, Qwn1 are ON/OFF signals for switching the switching elements Sup1, Sun1, Svp1, Svn1, Swp1, Swn1, respectively, ON and OFF in the power converter 4a.

It is assumed hereafter that when the ON/OFF signals Qup1, Qun1, Qvp1, Qvn1, Qwp1, Qwn1 have a value of 1, signals for switching the corresponding switches ON are output, and when the ON/OFF signals Qup1, Qun1, Qvp1, Qvn1, Qwp1, Qwn1 have a value of 0, signals for switching the corresponding switches OFF are output.

Note that each of the semiconductor switches Sup1 to Swn1 may be constituted by a semiconductor switch such as an IGBT, a bipolar transistor, or a MOS power transistor, and a diode connected in anti-parallel to the semiconductor switch.

Next, a control unit 5a will be described. A voltage command calculator 6 calculates three-phase voltage commands Vu1, Vv1, Vw1 relating to voltages to be applied to the three-phase windings in order to drive the AC rotary machine 1, and outputs the calculated three-phase voltage commands Vu1, Vv1, Vw1 to an offset calculator 7a.

Current feedback control, in which a current command for the AC rotary machine 1 is set as a control command and then the three-phase voltage commands Vu1, Vv1, Vw1 are calculated by proportional integral control so as to reduce to zero respective deviations between the control command and the currents Iu1, Iv1, Iw1 flowing through the three-phase windings, which are detected by a current detector 11a to be described below, or the like may be used as a method of calculating the three-phase voltage commands Vu1 to Vw1. This control method is well-known technology, and therefore detailed description thereof has been omitted.

Figure 2:
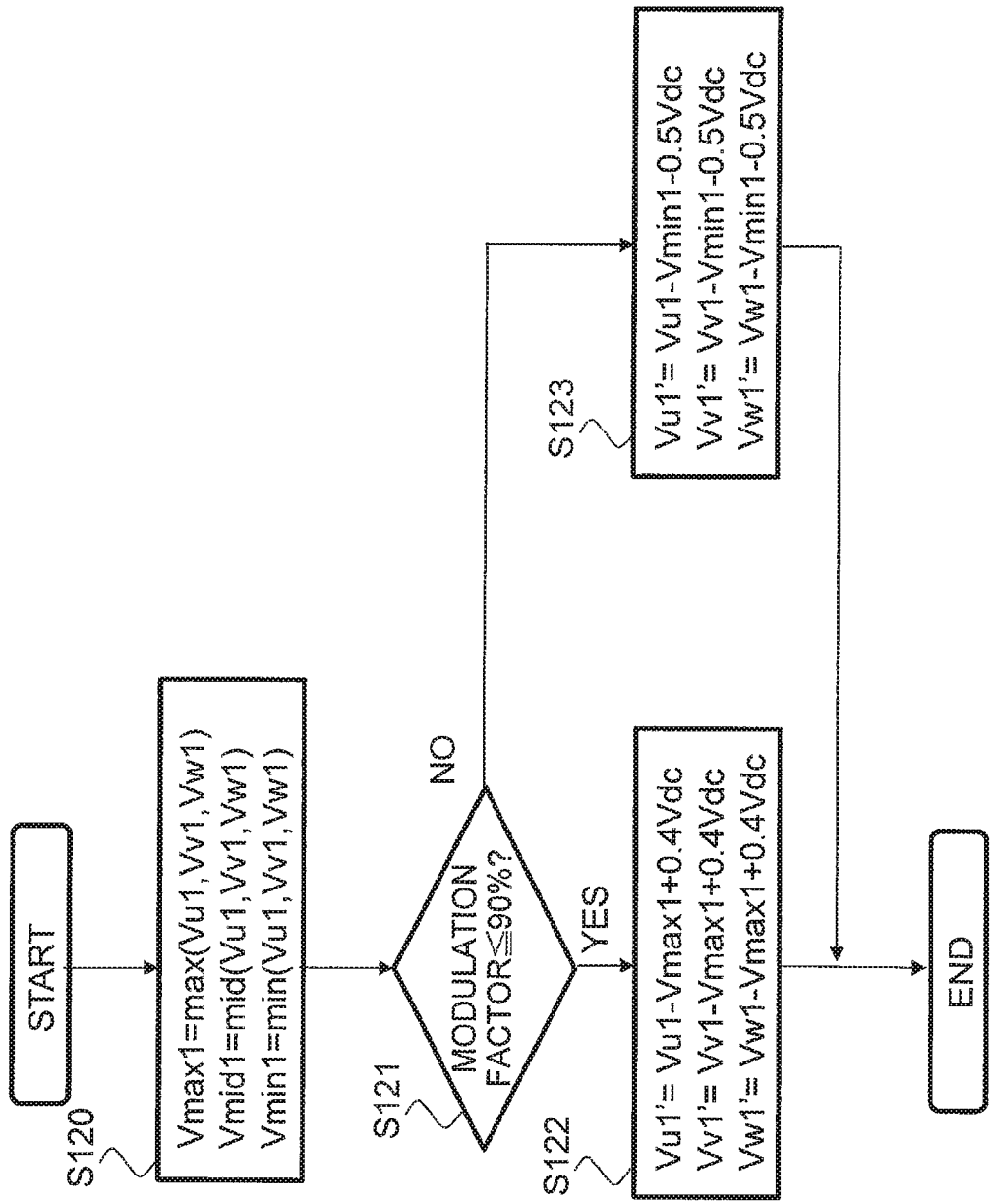
FIG. 2 is a flowchart showing a series of calculation processes executed by an offset calculator according to the first embodiment of this invention.

The offset calculator 7a calculates three-phase applied voltages Vu1', Vv1', Vw1' on the basis of the three-phase voltage commands Vu1, Vv1, Vw1. FIG. 2 is a flowchart showing a series of calculation processes executed by the offset calculator 7a according to the first embodiment of this invention. In step S120, the offset calculator 7a assigns the three-phase voltage commands Vu1, Vv1, Vw1 in descending order to a maximum phase Vmax1, an intermediate phase Vmid1, and a minimum phase Vmin1.

Figure 8:
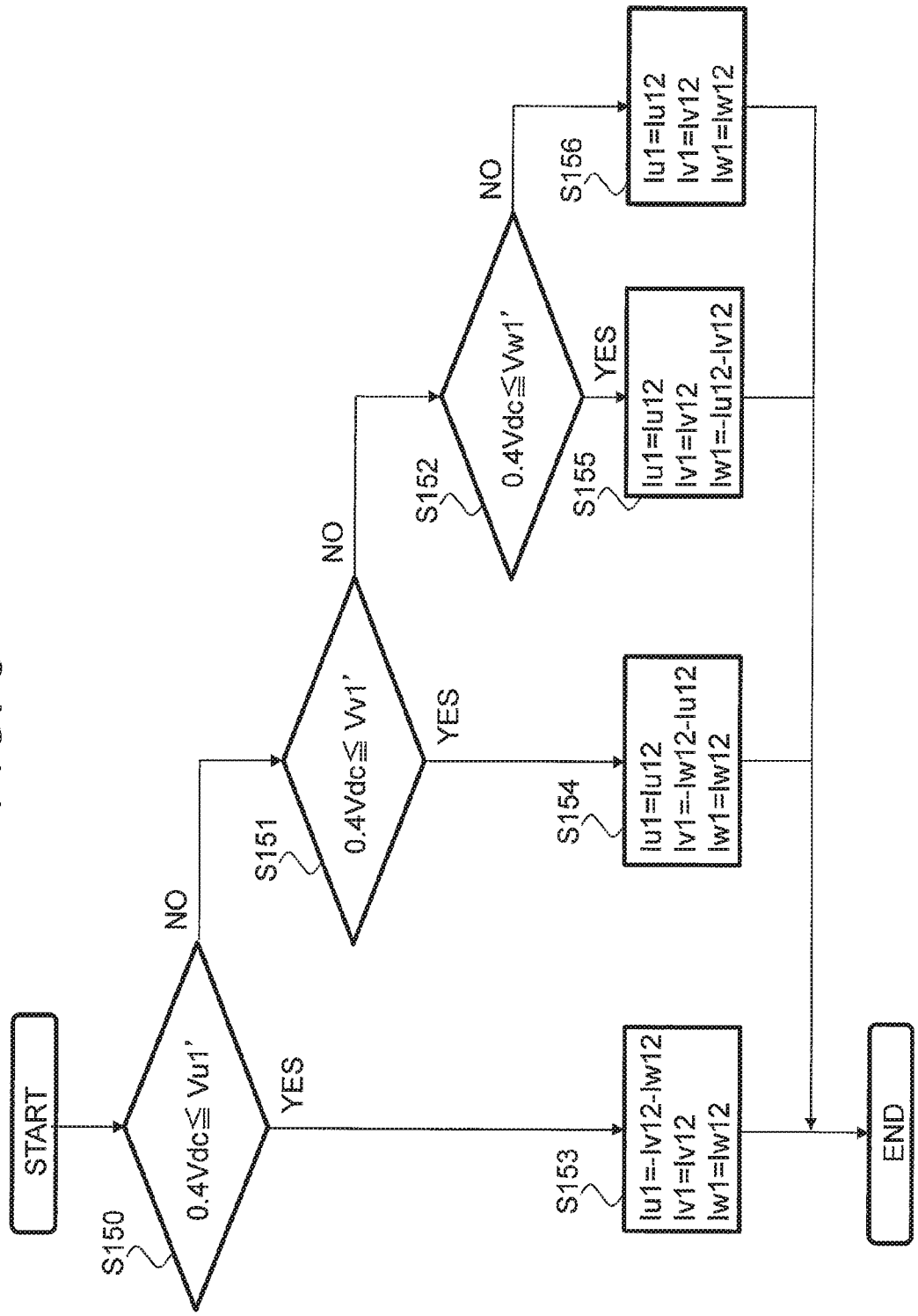
FIG. 8 is a flowchart showing a series of operations executed by the calculator according to the first embodiment of this invention to calculate the detected currents Iu1, Iv1, Iw1 when data obtained at a second timing are selected.

Next, in step S121, the offset calculator 7a determines whether or not a modulation factor is equal to or lower than 90%. When the determination result is affirmative (YES), the offset calculator 7a executes step S122, and when the determination result is negative (NO), the offset calculator 7a executes step S123. Note that the offset calculator 7a may implement the determination processing of step S121 using a difference between the maximum phase Vmax1 and the minimum phase Vmin1, as illustrated in FIG. 8 of PTL 3, instead of the modulation factor.

After advancing to step S122, the offset calculator 7a calculates the three-phase applied voltages Vu1', Vv1', Vw1' by subtracting the maximum phase Vmax1 from the voltages of all of the three-phase voltage commands Vu1, Vv1, Vw1 and adding 0.4 times the DC voltage Vdc thereto. As a result of the calculations implemented in step S122, the voltage commands Vu1, Vv1, Vw1 are offset such that the voltage of the phase corresponding to the maximum phase matches 0.4 Vdc.

Here, 0.4 Vdc is equal to the maximum applied voltage at which a phase current detection time can be secured. By executing step S122, therefore, the voltages of all of the voltage commands Vu1, Vv1, Vw1 are offset such that among the three-phase applied voltages, the applied voltage of the phase corresponding to the maximum phase matches the maximum value 0.4 Vdc of a carrier wave signal.

When the offset calculator 7a advances to step S123, on the other hand, the difference between the maximum phase Vmax1 and the minimum phase Vmin1 exceeds 0.9 Vdc, and therefore the three-phase applied voltages Vu1', Vv1', Vw1' cannot be kept between −0.5 Vdc and 0.4 Vdc regardless of the voltage by which the voltage commands Vu1, Vv1, Vw1 are offset. In this case, therefore, the voltage commands Vu1, Vv1, Vw1 are offset such that the voltage of the phase corresponding to the minimum phase matches −0.5 Vdc.

In the following description, the modulation method executed in step S123 will be defined as "lower solid modulation". When the modulation factor is no higher than 90%, the modulation method of step S122 can be realized, but when the modulation factor exceeds 90% and the determination processing is executed using the difference between the maximum phase Vmax1 and the minimum phase Vmin1, as illustrated in FIG. 8 of PTL 3, a case in which step S123 is required may, depending on the angle, occur.

Here, similarly to the examples in PTL 1 and PTL 3, the phase current detection time is set at 5 µs, and 90% is set as a threshold. Note, however, that the threshold of the modulation factor may be designed in accordance with an actual machine in consideration of a ringing settling time included in a detection waveform, a conversion time of an analog/digital converter, a time required for sampling and holding, and so on.

Figure 3:
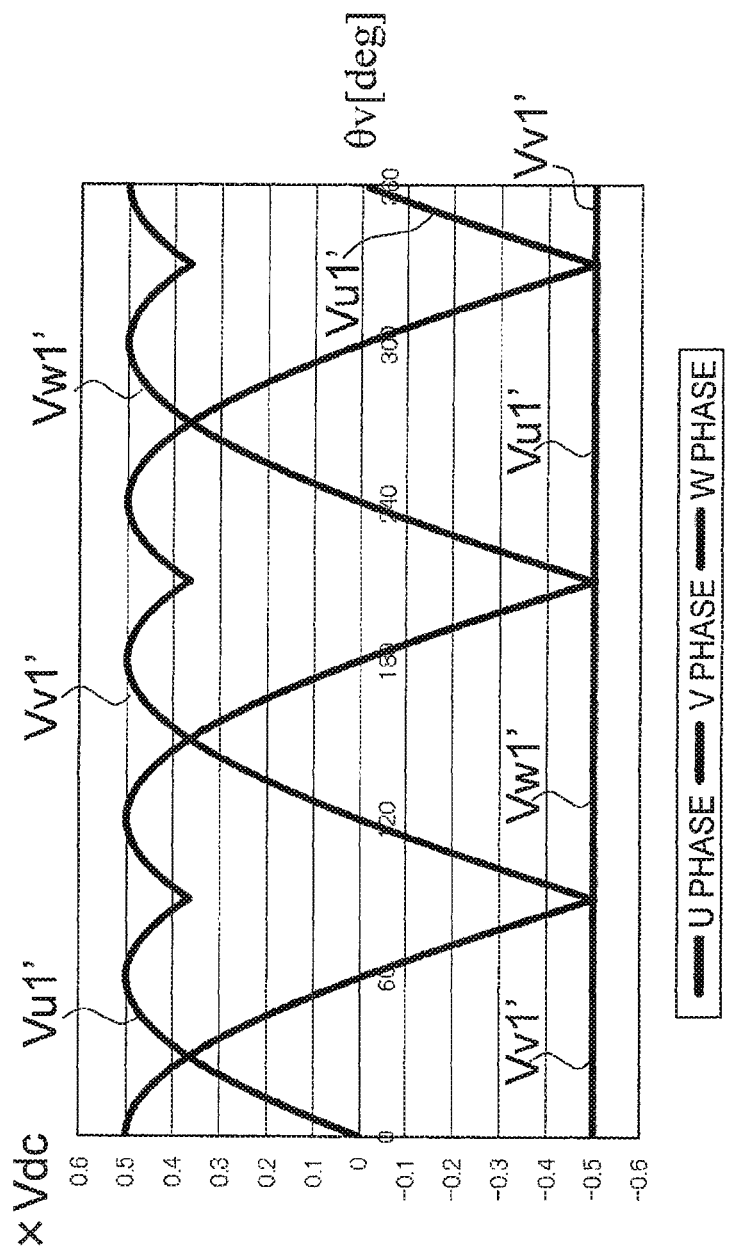
FIG. 3 is a view showing three-phase applied voltages Vu1', Vv1', Vw1' in a case where a modulation factor is 100%, according to the first embodiment of this invention.

FIG. 3 is a view showing the three-phase applied voltages Vu1', Vv1', Vw1' in a case where the modulation factor is 100%, according to the first embodiment of this invention. The abscissa shows a voltage phase θv [deg], and the ordinate shows a ratio to the DC voltage Vdc. The three-phase voltage commands Vu1, Vv1, Vw1 have sinusoidal waveforms with an amplitude of Vdc/√3, using 0 as a reference.

As shown in FIG. 3, by executing step S123, lower solid modulation is realized such that the applied voltage of the phase corresponding to the minimum phase remains at −0.5 Vdc at all times, while the applied voltage of the phase corresponding to the maximum phase reaches 0.5 Vdc at 60 deg intervals.

In FIG. 3, the applied voltage of the phase corresponding to the maximum phase exceeds 0.4 Vdc at substantially all angles. Therefore, when lower solid modulation is implemented, the current detection precision deteriorates due to the effect of switching noise generated in the maximum phase.

In PTL 1, meanwhile, the currents of the two phases that are not affected by switching noise are obtained by setting the maximum phase at 0.5 Vdc. With this method, however, the ON time of the high potential side switching elements exceeds the ON time of the low potential side switching elements. As a result, unevenness occurs in a heat generation condition, and therefore, in a case where high-rotation use occurs frequently, leeway remains in a heat resistance performance of the low potential side switching elements, whereas current limitation is applied to the high potential side switching elements due to the heat resistance performance thereof.

Hence, a technical feature of the first embodiment is that current detection is performed twice, at a first timing and a second timing, in order to obtain current detection values that are not affected by switching noise in substantially all regions, regardless of the modulation method.

An ON/OFF signal generator 8 outputs the ON/OFF signals Qup1, Qun1, Qvp1, Qvn1, Qwp1, Qwn1 on the basis of the three-phase applied voltages Vu1', Vv1', Vw1'.

Figure 4:
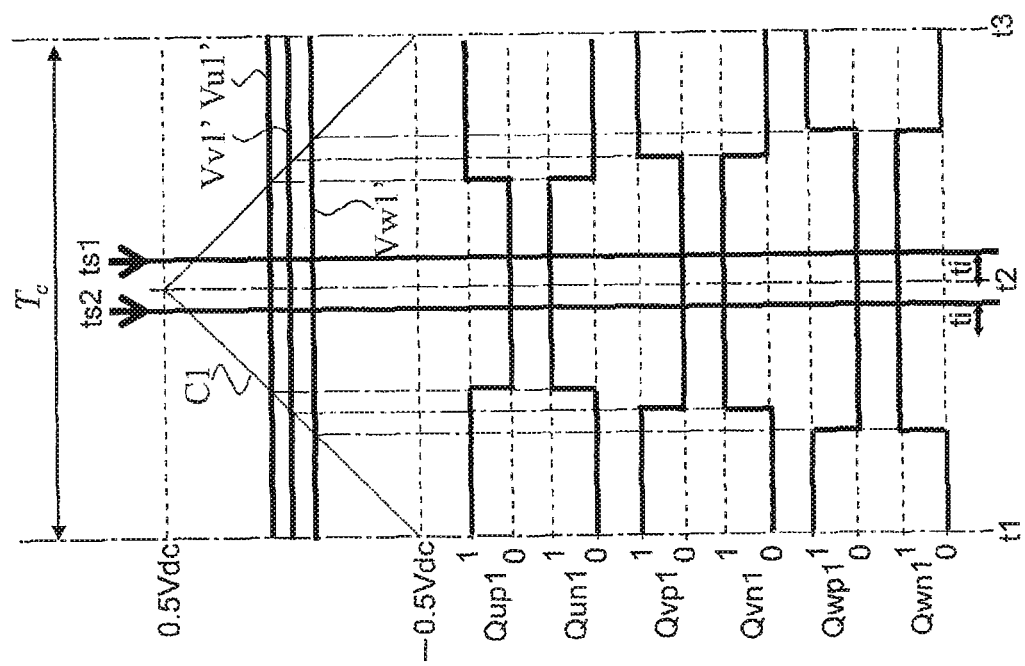
FIG. 4 is an illustrative view showing an operation of an ON/OFF signal generator according to the first embodiment of this invention.

FIG. 4 is an illustrative view showing an operation of the ON/OFF signal generator 8 according to the first embodiment of this invention. In FIG. 4, C1 denotes a carrier wave signal constituted by a triangular wave that has a period Tc and reaches a minimum value of −0.5 Vdc at t1 and t3 and a maximum value of 0.5 Vdc at t2 between t1 and t3.

The ON/OFF signal generator 8 compares C1 to Vu1', outputs "Qup1=1 and Qun1=0" when Vu1' is greater than C1, and outputs "Qup1=0 and Qun1=1" when Vu1' is equal to or smaller than C1.

Similarly, the ON/OFF signal generator 8 compares C1 to Vv1', outputs "Qvp1=1 and Qvn1=0" when Vv1' is greater than C1, and outputs "Qvp1=0 and Qvn1=1" when Vv1' is equal to or smaller than C1.

Similarly, the ON/OFF signal generator 8 compares C1 to Vw1', outputs "Qwp1=1 and Qwn1=0" when Vw1' is greater than C1, and outputs "Qwp1=0 and Qwn1=1" when Vw1' is equal to or smaller than C1.

A first timing ts1 and a second timing ts2 denote current detection timings. The current detector 11a shown in FIG. 1 is constituted by a current detection resistance element 9a and a calculator 10a. The current detection resistance element 9a is provided in series with each phase of the low potential side switching elements Sun1, Svn1, Swn1 of the power converter 4a, whereby the calculator 10a detects the currents flowing through the three-phase windings.

More specifically, the calculator 10a detects currents Iu11, Iv11, Iw11 flowing through the three-phase windings at the first timing ts1, and detects currents Iu12, Iv12, Iw12 flowing through the three-phase windings at the second timing ts2.

The calculator 10a calculates the detected currents Iu1, Iv1, Iw1 from Iu11, Iv11, Iw11 and Iu12, Iv12, Iw12, which are obtained from the currents flowing through the current detection resistance elements 9a.

Here, a time required for the current detector 11a to detect the currents is set at ti. More specifically, ti corresponds to a lower limit value of an energization time of the current detection resistance elements 9a, which is determined in consideration of the ringing settling time included in the detection waveform, the conversion time of the analog/digital converter, and the time required for sampling and holding.

In FIG. 4, to ensure that the current values are detected accurately by the current detector 11a at the first timing ts1, the ON/OFF signals Qup1, Qun1, Qvp1, Qvn1, Qwp1, Qwn1 applied to the power converter 4a must not be switched from 0 to 1 or from 1 to 0 during a period extending from ts1−ti to ts1.

If the ON/OFF signals are switched, noise becomes intermixed in the detected currents Iu11, Iv11, Iw11 such that control is implemented on the basis of inaccurate detection values, and as a result, vibration and noise are generated by the AC rotary machine 1.

Similarly, in FIG. 4, to ensure that the current values are detected accurately by the current detector 11a at the second timing ts2, the ON/OFF signals Qup1, Qun1, Qvp1, Qvn1, Qwp1, Qwn1 applied to the power converter 4a must not be switched from 0 to 1 or from 1 to 0 during a period extending from ts2−ti to ts2.

If the ON/OFF signals are switched, noise becomes intermixed in the detected currents Iu12, Iv12, Iw12 such that control is implemented on the basis of inaccurate detection values, and as a result, vibration and noise are generated by the AC rotary machine 1.

When the first timing ts1 is set to be later than t2 but within ti/2 after t2, Equation (1), shown below, must be satisfied to ensure that the currents can be detected accurately. Here, the reason for setting the first timing ts1 at a time within ti/2 after t2 is that if the first timing ts1 is set to be any later, noise generated when the ON/OFF signals are switched from 0 to 1 or from 1 to 0 following t2 has an effect.

$$V\text{max}' < (2(ts1-ti)/Tc - 0.5)Vdc \quad (1)$$

As can be seen from Equation (1), when the first timing ts1 is set at ti/2 after t2, an applied voltage Vmax' of the maximum phase can be maximized, and when Equation (2), shown below, is satisfied, the currents of the three phases can be detected at the first timing ts1.

$$V\text{max}' < (0.5 - ti/Tc)Vdc \quad (2)$$

Further, when Vmax' is 0.5 Vdc, no switching operations are implemented during a single period of the carrier wave signal, and therefore the high potential side switching elements remain ON at all times. At this time, the current of the maximum phase cannot be detected, and therefore the currents of the two phases that do not include switching noise are detected.

In the description heretofore, when Tc is set at 50 µs, ti is set at 5 µs, and the applied voltages of all three phases are no lower than 0.4 Vdc and lower than 0.5 Vdc, where 0.4 Vdc serves as a first predetermined value, current detection values that do not include switching noise can be obtained at the first timing ts1.

At the second timing ts2, therefore, it is sufficient to be able to detect the currents in regions where detection at the first timing ts1 is impossible, and to be able to obtain current detection values that do not include switching noise when Vmax'≥0.4 Vdc. In other words, the currents need to be detected before the high potential side switching element of the maximum phase is switched ON. For this purpose, the second timing ts2 needs to satisfy Equation (3), shown below.

$$ts2 <= t2 - ti/2 \quad (3)$$

Content implemented by the calculator 10a will be described below, using a case in which the first timing ts1 is set at 2.4 µs after t2 and the second timing ts2 is set at 2.6 µs before t2 as a specific example.

Figure 5:
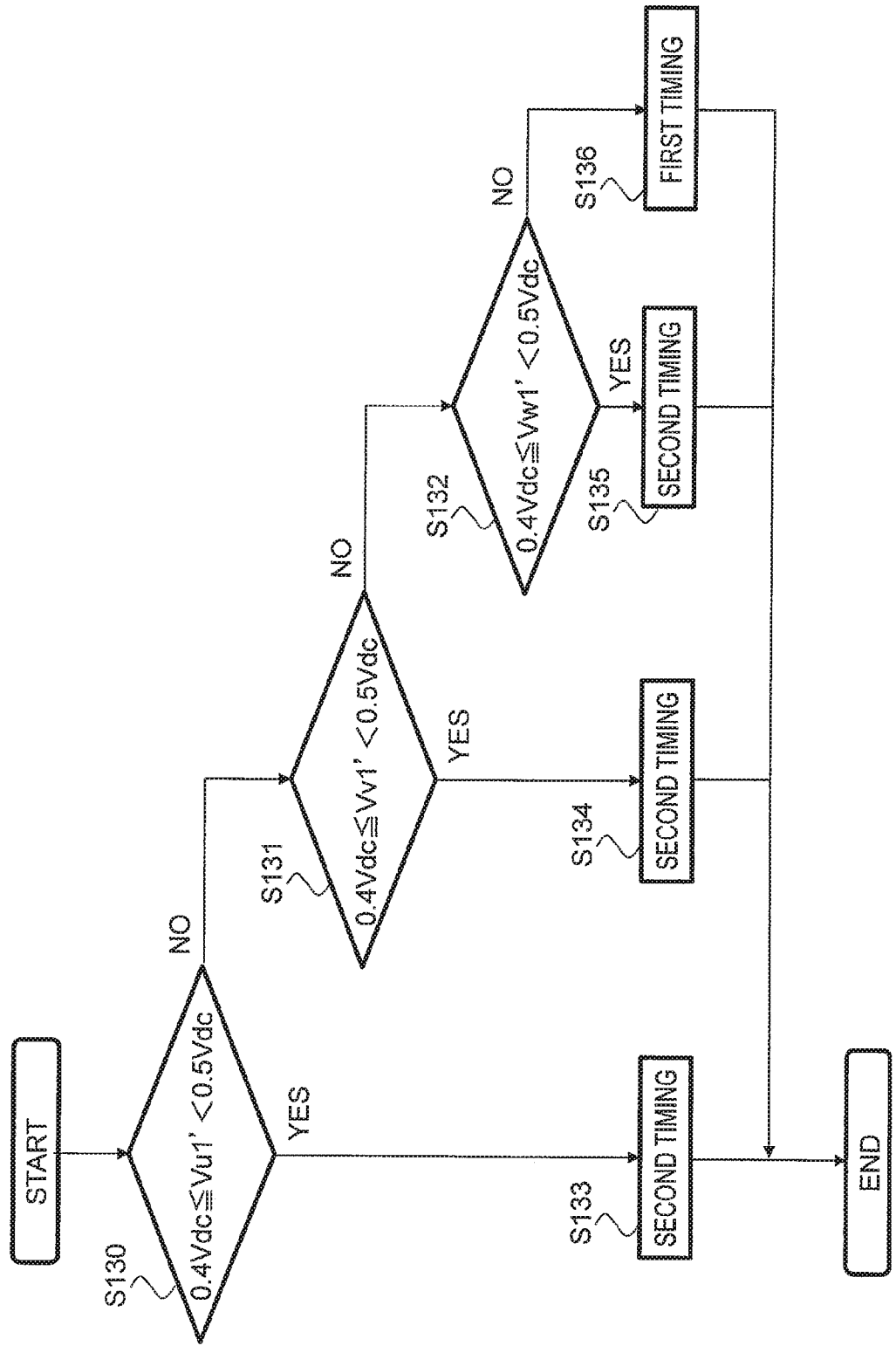
FIG. 5 is a flowchart showing a series of calculation processes executed by a calculator according to the first embodiment of this invention.

FIG. 5 is a flowchart showing a series of calculation processes executed by the calculator 10*a* according to the first embodiment of this invention. More specifically, the flowchart in FIG. 5 shows procedures for determining which data, among data obtained at the respective timings, are to be used as the current detection values.

In step S130, the calculator 10*a* determines whether or not the U phase applied voltage Vu1' is no lower than 0.4 Vdc and lower than 0.5 Vdc. When the determination result is affirmative (YES), the calculator 10*a* executes step S133, and when the determination result is negative (NO), the calculator 10*a* executes step S131.

In step S131, the calculator 10*a* determines whether or not the V phase applied voltage Vv1' is no lower than 0.4 Vdc and lower than 0.5 Vdc. When the determination result is affirmative (YES), the calculator 10*a* executes step S134, and when the determination result is negative (NO), the calculator 10*a* executes step S132.

In step S132, the calculator 10*a* determines whether or not the W phase applied voltage Vw1' is no lower than 0.4 Vdc and lower than 0.5 Vdc. When the determination result is affirmative (YES), the calculator 10*a* executes step S135, and when the determination result is negative (NO), the calculator 10*a* executes step S136.

After advancing to step S133, step S134, and step S135, the calculator 10*a* uses the data detected at the second timing ts2 as the current detection values, and after advancing to step S136, the calculator 10*a* uses the data detected at the first timing ts1 as the current detection values. Note that in the flowchart of FIG. 5, the determinations are made in order of U, V, W, but the determinations may be made in another order.

Figure 6:
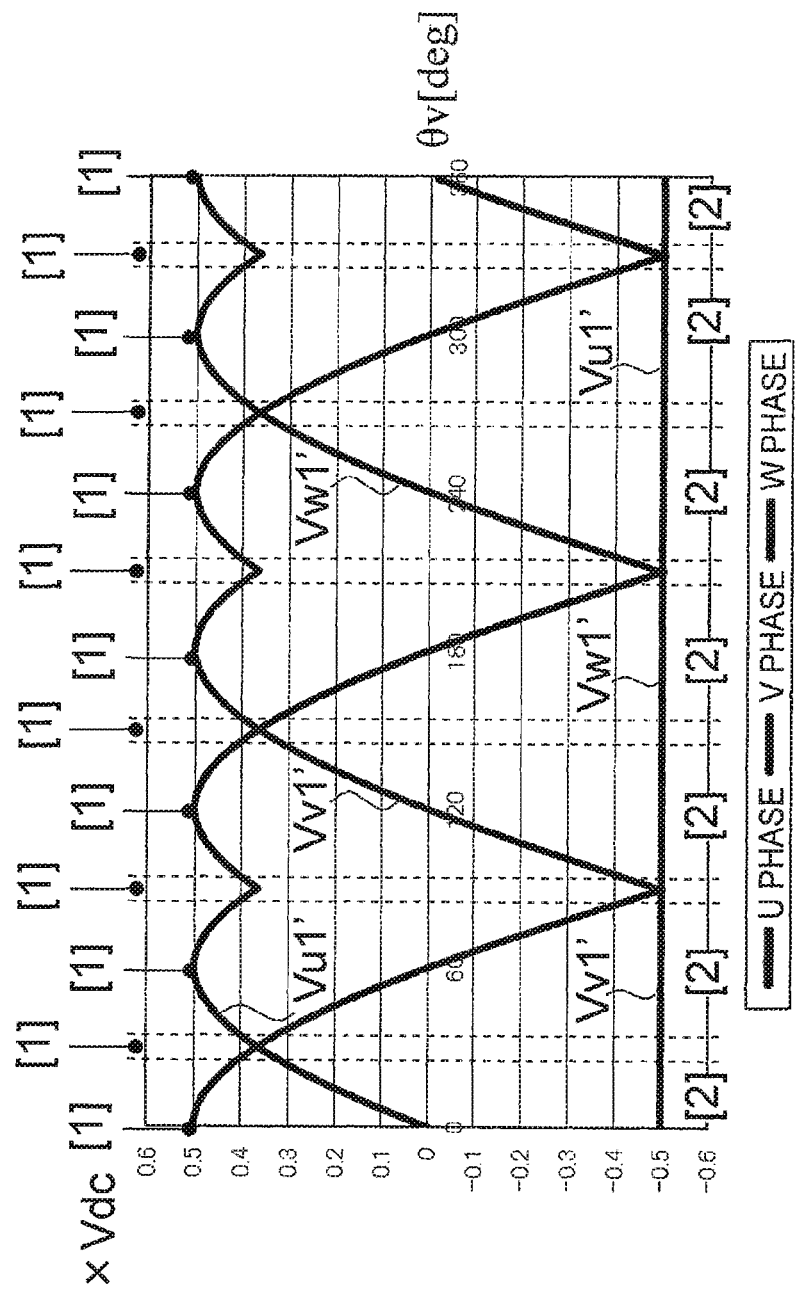
FIG. 6 is a view showing which data, among data obtained at respective timings, are to be used at each electrical angle, the data being selected on the basis of determination results obtained by the calculator according to the first embodiment of this invention.

FIG. 6 is a view showing which data, among the data obtained at the respective timings, are to be used at each electrical angle, the data being selected on the basis of the determination results obtained by the calculator 10*a* according to the first embodiment of this invention. In FIG. 6, [1] denotes ranges in which the detection results obtained at the first timing ts1 are selected, and [2] denotes ranges in which the detection results obtained at the second timing ts2 are selected.

Note that locations set at [1] and indicating a single point at 0 deg, 60 deg, 120 deg, 180 deg, 240 deg, and 300 deg are locations where [1] is selected when the maximum phase is at 0.5 Vdc.

Figure 7:
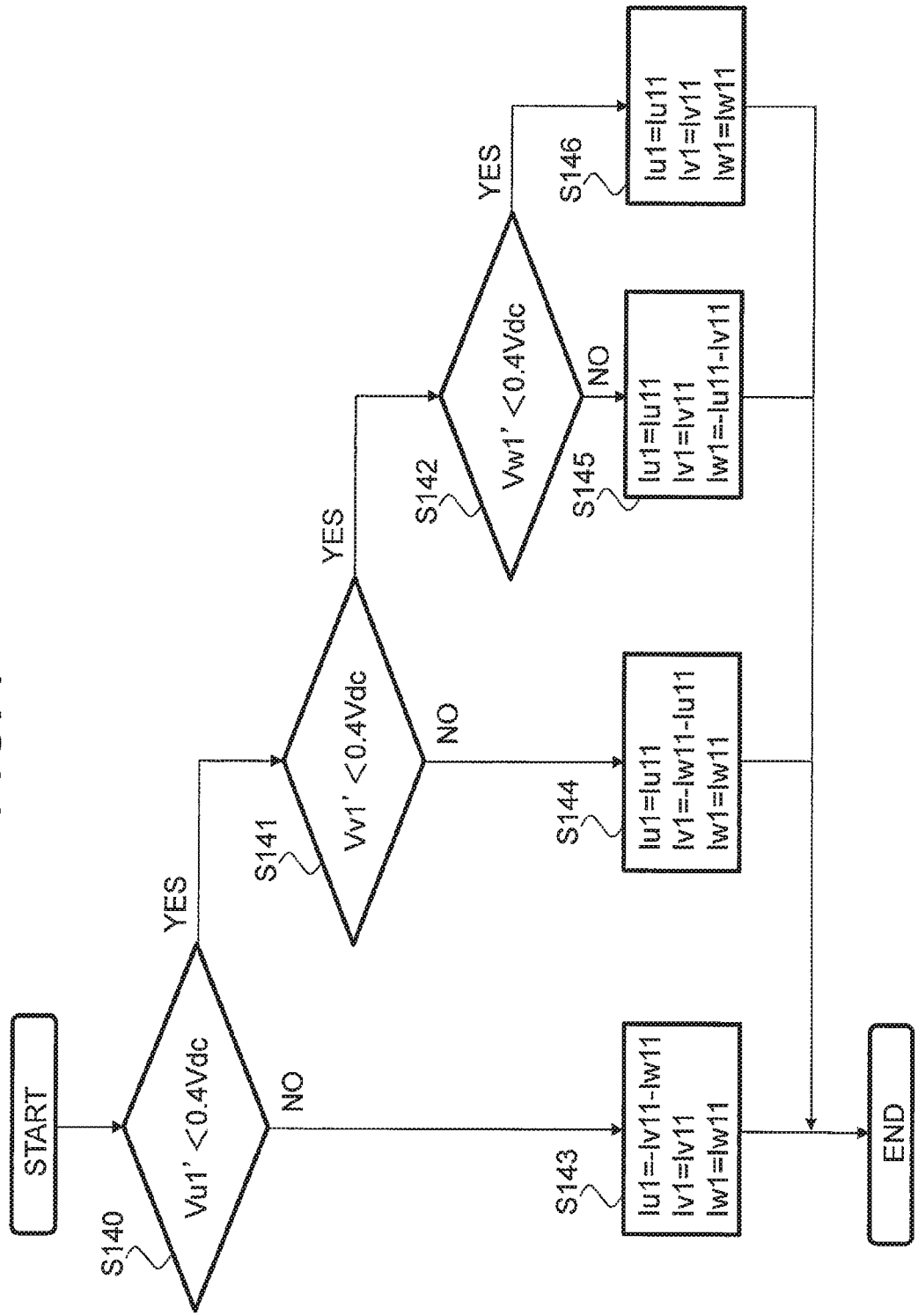
FIG. 7 is a flowchart showing a series of operations executed by a calculator according to the first embodiment of this invention to calculate detected currents Iu1, Iv1, Iw1 when data obtained at a first timing are selected.

FIG. 7 is a flowchart showing a series of operations executed by the calculator 10*a* according to the first embodiment of this invention to calculate the detected currents Iu1, Iv1, Iw1 when the data obtained at the first timing are selected. In step S140, the calculator 10*a* determines whether or not the U phase applied voltage Vu1' is lower than 0.4 Vdc. When the determination result is affirmative (YES), the calculator 10*a* executes step S141, and when the determination result is negative (NO), the calculator 10*a* executes step S143.

In step S141, the calculator 10*a* determines whether or not the V phase applied voltage Vv1' is lower than 0.4 Vdc. When the determination result is affirmative (YES), the calculator 10*a* executes step S142, and when the determination result is negative (NO), the calculator 10*a* executes step S144.

In step S142, the calculator 10*a* determines whether or not the W phase applied voltage Vw1' is lower than 0.4 Vdc. When the determination result is affirmative (YES), the calculator 10*a* executes step S146, and when the determination result is negative (NO), the calculator 10*a* executes step S145.

When the calculator 10*a* advances to step S143, the U phase serving as the maximum phase is at 0.5 Vdc and cannot therefore be detected. Accordingly, the calculator 10*a* calculates the current of the U phase from the other two phases, using the fact that Iu1+Iv1+Iw1=0.

When the calculator 10*a* advances to step S144, the V phase serving as the maximum phase is at 0.5 Vdc and cannot therefore be detected. Accordingly, the calculator 10*a* calculates the current of the V phase from the other two phases, using the fact that Iu1+Iv1+Iw1=0.

When the calculator 10*a* advances to step S145, the W phase serving as the maximum phase is at 0.5 Vdc and cannot therefore be detected. Accordingly, the calculator 10*a* calculates the current of the W phase from the other two phases, using the fact that Iu1+Iv1+Iw1=0.

When the calculator 10*a* advances to step S146, all of the currents can be detected, and therefore the calculator 10*a* sets the respective detection values as the detected currents. Note that in the flowchart of FIG. 7, the determinations are made in order of U, V, W, but the determinations may be made in another order.

Meanwhile, FIG. 8 is a flowchart showing a series of operations executed by the calculator 10*a* according to the first embodiment of this invention to calculate the detected currents Iu1, Iv1, Iw1 when the data obtained at the second timing are selected. In step S150, the calculator 10*a* determines whether or not the U phase applied voltage Vu1' equals or exceeds 0.4 Vdc. When the determination result is affirmative (YES), the calculator 10*a* executes step S153, and when the determination result is negative (NO), the calculator 10*a* executes step S152.

In step S151, the calculator 10*a* determines whether or not the V phase applied voltage Vv1' equals or exceeds 0.4 Vdc. When the determination result is affirmative (YES), the calculator 10*a* executes step S154, and when the determination result is negative (NO), the calculator 10*a* executes step S152.

In step S152, the calculator 10*a* determines whether or not the W phase applied voltage Vw1' equals or exceeds 0.4 Vdc. When the determination result is affirmative (YES), the calculator 10*a* executes step S155, and when the determination result is negative (NO), the calculator 10*a* executes step S156.

When the calculator 10*a* advances to step S153, the low potential side switching element of the U phase serving as the maximum phase is OFF at the second timing, and therefore the U phase cannot be detected. Accordingly, the calculator 10*a* calculates the current of the U phase from the other two phases, using the fact that Iu1+Iv1+Iw1=0.

When the calculator 10*a* advances to step S154, the low potential side switching element of the V phase serving as the maximum phase is OFF at the second timing, and therefore the V phase cannot be detected. Accordingly, the calculator 10*a* calculates the current of the V phase from the other two phases, using the fact that Iu1+Iv1+Iw1=0.

When the calculator 10*a* advances to step S155, the low potential side switching element of the W phase serving as the maximum phase is OFF at the second timing, and therefore the W phase cannot be detected. Accordingly, the calculator 10*a* calculates the current of the W phase from the other two phases, using the fact that Iu1+Iv1+Iw1=0.

When the calculator 10*a* advances to step S156, all of the currents can be detected, and therefore the calculator 10*a* sets the respective detection values as the detected currents. Note, however, that at the selection timing of FIG. 5, the applied voltage of one of the phases equals or exceeds 0.4 Vdc, and therefore, in actuality, step S156 is not used. Also note that in the flowchart of FIG. 8, the determinations are made in order of U, V, W, but the determinations may be made in another order.

Incidentally, the ranges in which [2] is selected also include cases in which switching noise has an effect. A condition of the applied voltages for ensuring that switching noise does not have an effect at the second timing ts2 is as shown below in Equation (4), which is based on a similar concept to Equation (1). Here, the condition is set at no more than 0.196 Vdc.

$$V\text{mid}' <= (2(ts2-ti)/Tc - 0.5) Vdc \quad (4)$$

Considering the applied voltages at 140 deg, for example, the applied voltage of the V phase, which serves as the intermediate phase, is 0.27 Vdc. In other words, an error caused by V phase switching noise is included in the current detection values obtained at the second timing ts2. This phenomenon occurs in regions that are set at [2] and located on either side of electrical angles at which the intermediate phase and the maximum phase are equal. Six of these regions exist over a single period of the carrier wave signal.

As is evident from the flowchart shown in FIG. 2, a condition in which lower solid modulation is required occurs in comparatively high rotation regions where the modulation factor is high. Accordingly, this condition is established for short periods, and therefore, when the effect of the switching noise is large, values obtained by advancing the phases relative to previous current detection values may be used. Note that Equation (22) of PTL 4 or the like may be used as a specific method of advancing the phases.

Figure 9:
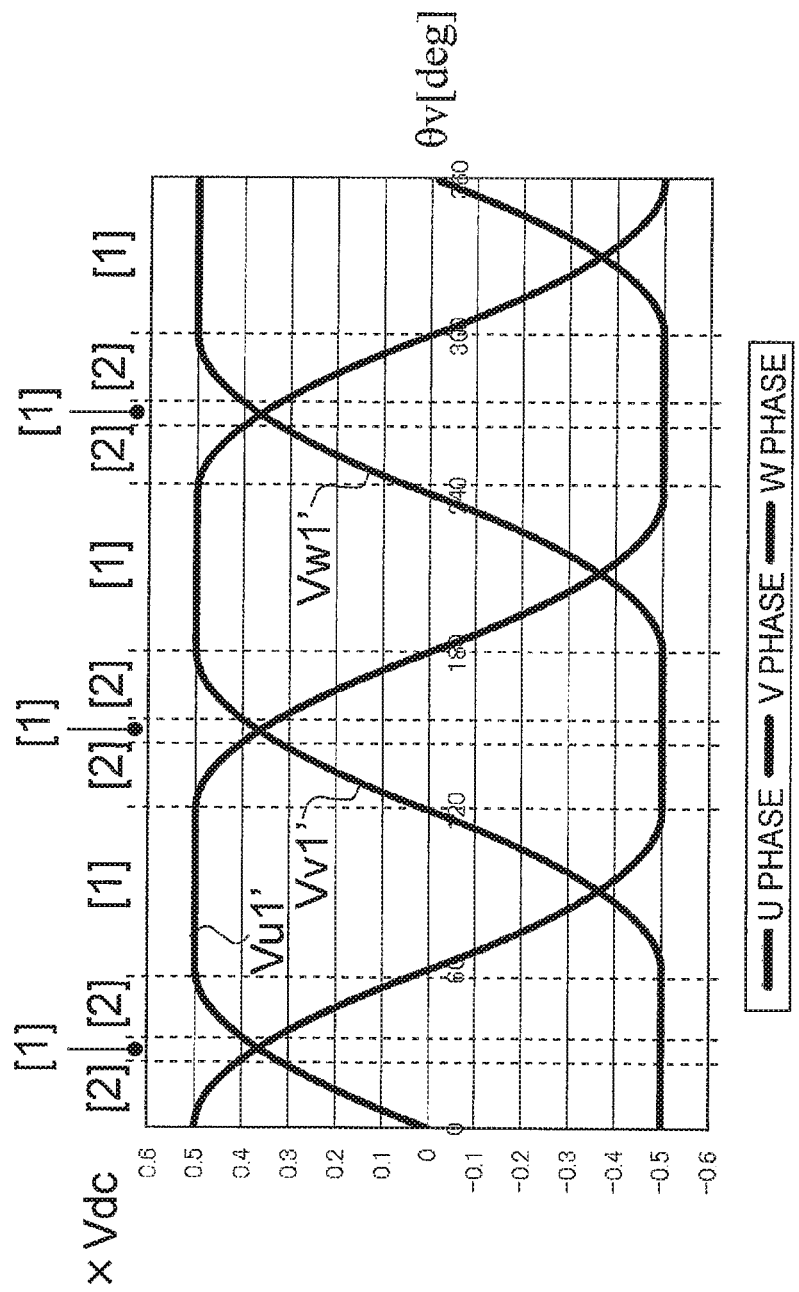
FIG. 9 is a view showing the applied voltages in a case where a voltage superimposition method (two-phase modulation), which is different to lower solid modulation, is employed using an offset calculator 7b in place of the offset calculator, according to the first embodiment of this invention.

FIG. 9 is a view showing the applied voltages in a case where a voltage superimposition method (two-phase modulation), which is different to lower solid modulation, is employed using an offset calculator 7b in place of the offset calculator 7a, according to the first embodiment of this invention. The abscissa shows the voltage phase θv [deg], and the ordinate shows the ratio to the DC voltage Vdc. Two-phase modulation is well-known technology, and therefore description thereof using flowcharts and the like has been omitted.

With two-phase modulation, similarly to lower solid modulation, detected currents that do not include an error caused by switching noise can be obtained at the first timing, and detected currents that do not include an error caused by switching noise can be obtained in substantially all regions at the second timing.

In other words, detected currents that do not include an error caused by switching noise can be obtained in substantially all regions even with a conventional modulation method in which only a detected current that includes an error caused by the effect of switching noise can be obtained at a single current detection timing. There is therefore no need to limit the modulation method to a method such as that of PTL 1, and as a result, it is possible to obtain a striking effect not present in the prior art, namely that the modulation method can be selected in accordance with use conditions.

Hence, according to the first embodiment, when either the applied voltages of the respective phases are all lower than the first predetermined value or one of the applied voltages of the respective phases is at the maximum value of the carrier wave signal, the detected currents are calculated on the basis of the current values detected at the first timing, and in all other cases, the detected currents are calculated on the basis of the current values detected at the second timing. As a result, it is possible to obtain a striking effect not present in the prior art, namely that current detection values that do not include switching noise can be obtained in substantially all region, enabling a reduction in noise and vibration generated in the AC rotary machine.

Further, the control device for an AC rotary machine according to the first embodiment can be applied to a control device for an electric power steering that uses an AC rotary machine to generate torque for assisting steering torque generated by a steering system. As a result of this application, it is possible to realize a control device for an electric power steering with which a torque ripple and noise generated by the steering system can be reduced.

Second Embodiment

Figure 10:
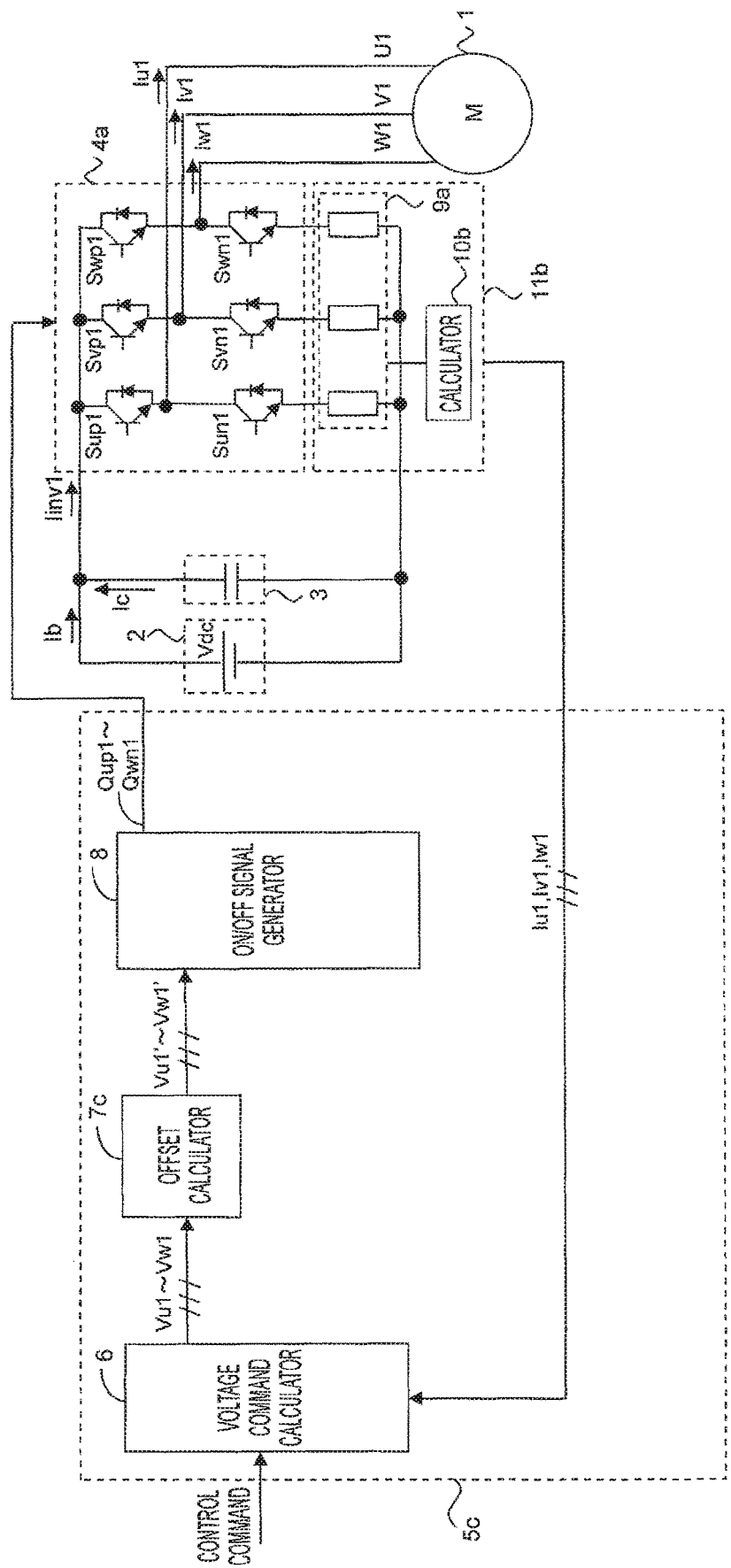
FIG. 10 is a view showing an overall configuration of a power conversion device according to a second embodiment of this invention.

FIG. 10 is a view showing an overall configuration of a power conversion device according to a second embodiment of this invention. The configuration of the second embodiment, shown in FIG. 10, differs from the configuration of the first embodiment, shown in FIG. 1, in relation to a control unit 5c, an offset calculator 7c, a calculator 10b, and a current detector 11b. Accordingly, the following description will center on these differences. Note that likewise in the second embodiment, a case in which Tc is set at 50 μs and ti is set at 5 μs will be described as an example.

Figure 11:
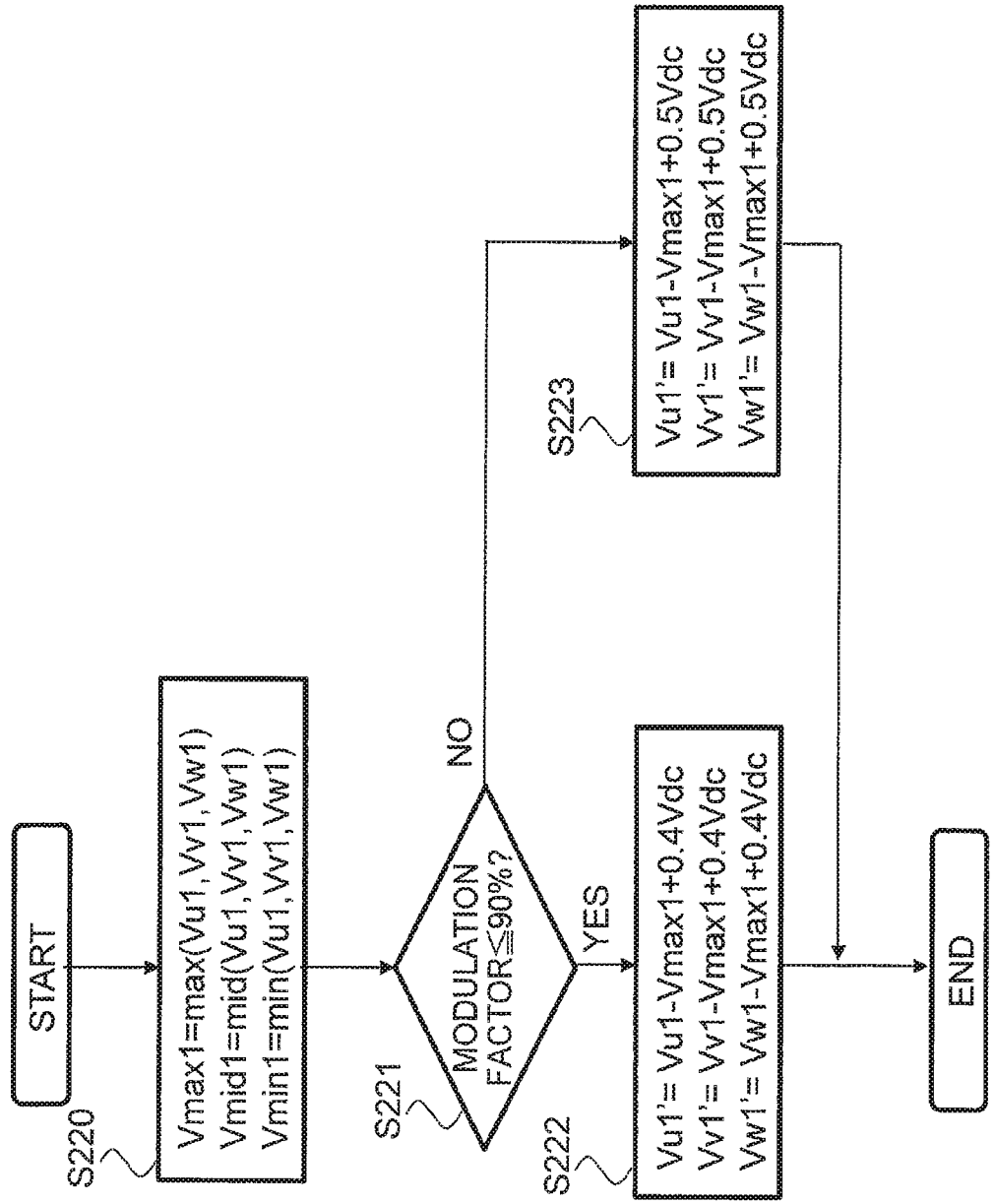
FIG. 11 is a flowchart showing a series of calculation processes executed by an offset calculator according to the second embodiment of this invention.

The offset calculator 7c calculates the three-phase applied voltages Vu1', Vv1', Vw1' on the basis of the three-phase voltage commands Vu1, Vv1, Vw1. FIG. 11 is a flowchart showing a series of calculation processes executed by the offset calculator 7c according to the second embodiment of this invention. In step S220, the offset calculator 7c assigns the three-phase voltage commands Vu1, Vv1, Vw1 in descending order to the maximum phase Vmax1, the intermediate phase Vmid1, and the minimum phase Vmin1.

Next, in step S221, the offset calculator 7c determines whether or not the modulation factor is equal to or lower than 90%. When the determination result is affirmative (YES), the offset calculator 7c executes step S222, and when the determination result is negative (NO), the offset calculator 7c executes step S223.

After advancing to step S222, the offset calculator 7c calculates the three-phase applied voltages Vu1', Vv1', Vw1' by subtracting the maximum phase Vmax1 from the voltages of all of the three-phase voltage commands Vu1, Vv1, Vw1 and adding 0.4 times the DC voltage Vdc thereto. As a result of the calculations implemented in step S222, the voltage commands Vu1, Vv1, Vw1 are offset such that the voltage of the phase corresponding to the maximum phase matches 0.4 Vdc.

Here, 0.4 Vdc is equal to the maximum applied voltage at which the phase current detection time can be secured. By executing step S222, therefore, the voltages of all of the voltage commands Vu1, Vv1, Vw1 are offset such that among the three-phase applied voltages, the applied voltage of the phase corresponding to the maximum phase matches the maximum value 0.4 Vdc of the carrier wave signal.

When the offset calculator 7c advances to step S223, on the other hand, the difference between the maximum phase Vmax1 and the minimum phase Vmin1 exceeds 0.9 Vdc, and therefore the three-phase applied voltages Vu1', Vv1', Vw1' cannot be held between −0.5 Vdc and 0.4 Vdc regardless of the voltage by which the voltage commands Vu1, Vv1, Vw1 are offset. In this case, therefore, the voltage commands Vu1, Vv1, Vw1 are offset such that the voltage of the phase corresponding to the maximum phase matches 0.5 Vdc.

In the following description, the modulation method executed in step S223 will be defined as "upper solid modulation". When the modulation factor is no higher than 90%, the modulation method of step S222 can be realized, but when the modulation factor exceeds 90%, a case in which step S223 is required may, depending on the angle, occur.

Here, the phase current detection time is set at 5 μs, and 90% is set as the threshold. Note, however, that the threshold of the modulation factor may be designed in accordance with an actual machine in consideration of the ringing settling time included in the detection waveform, the conversion time of the analog/digital converter, the time required for sampling and holding, and so on. Furthermore, the determination of step S221 is made in accordance with the modulation factor, but may be made in accordance with the difference between the maximum phase Vmax1 and the minimum phase Vmin1.

Figure 12:
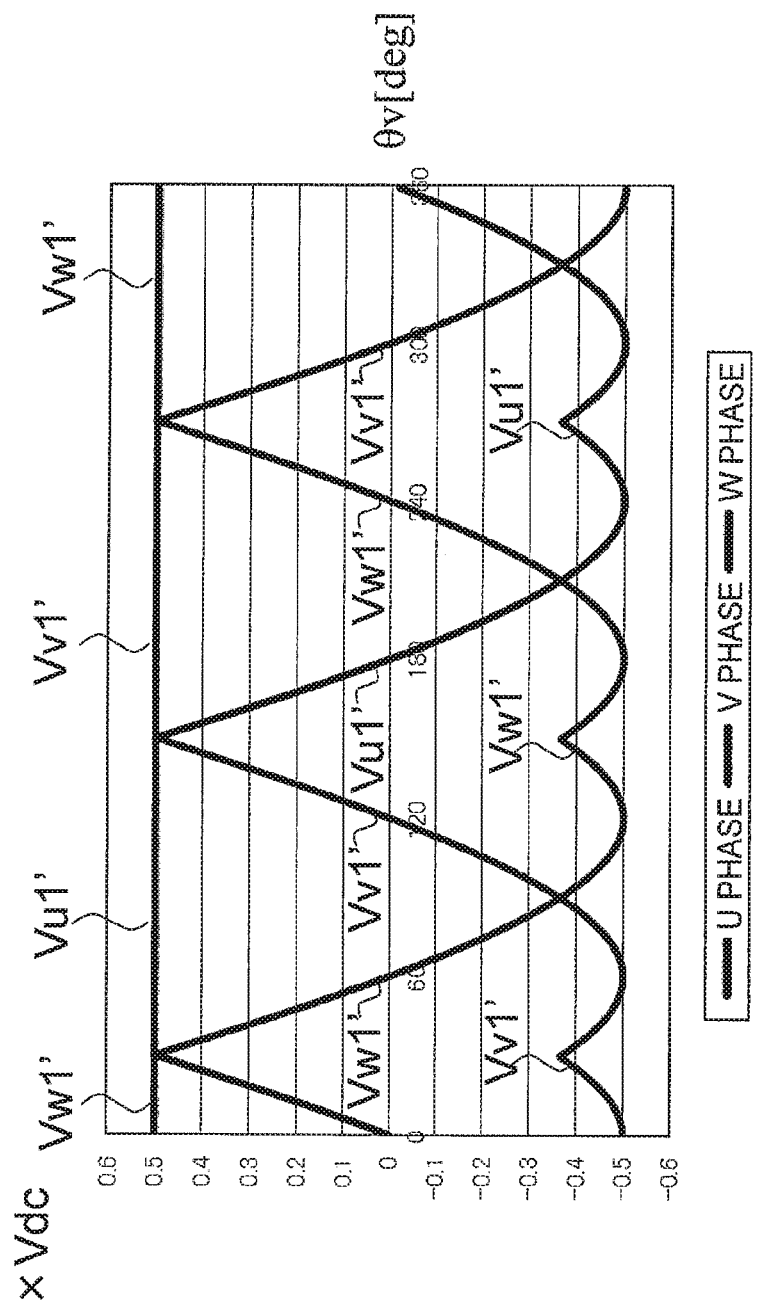
FIG. 12 is a view showing three-phase applied voltages Vu1', Vv1', Vw1' in a case where the modulation factor is 100%, according to the second embodiment of this invention.

FIG. 12 is a view showing the three-phase applied voltages Vu1', Vv1', Vw1' in a case where the modulation factor is 100%, according to the second embodiment of this invention. The abscissa shows the voltage phase θv [deg], and the ordinate shows the ratio to the DC voltage Vdc. The three-phase voltage commands Vu1, Vv1, Vw1 have sinusoidal waveforms with an amplitude of Vdc/√3, using 0 as a reference.

As shown in FIG. 12, by executing step S222, upper solid modulation is realized such that the applied voltage of the phase corresponding to the maximum phase remains at 0.5 Vdc at all times, while the applied voltage of the phase corresponding to the minimum phase falls to −0.5 Vdc at 60 deg intervals.

In FIG. 12, the applied voltage of the phase corresponding to the intermediate phase exceeds 0.4 Vdc in the vicinity of 30 deg, the vicinity of 150 deg, and the vicinity of 300 deg. Therefore, when upper solid modulation is implemented, the current detection precision deteriorates due to the effect of switching noise generated in the intermediate phase.

In PTL 1, meanwhile, currents of three phases that are not affected by switching noise are obtained by implementing lower solid modulation in these regions instead of setting the maximum phase at 0.5 Vdc.

Figure 13:
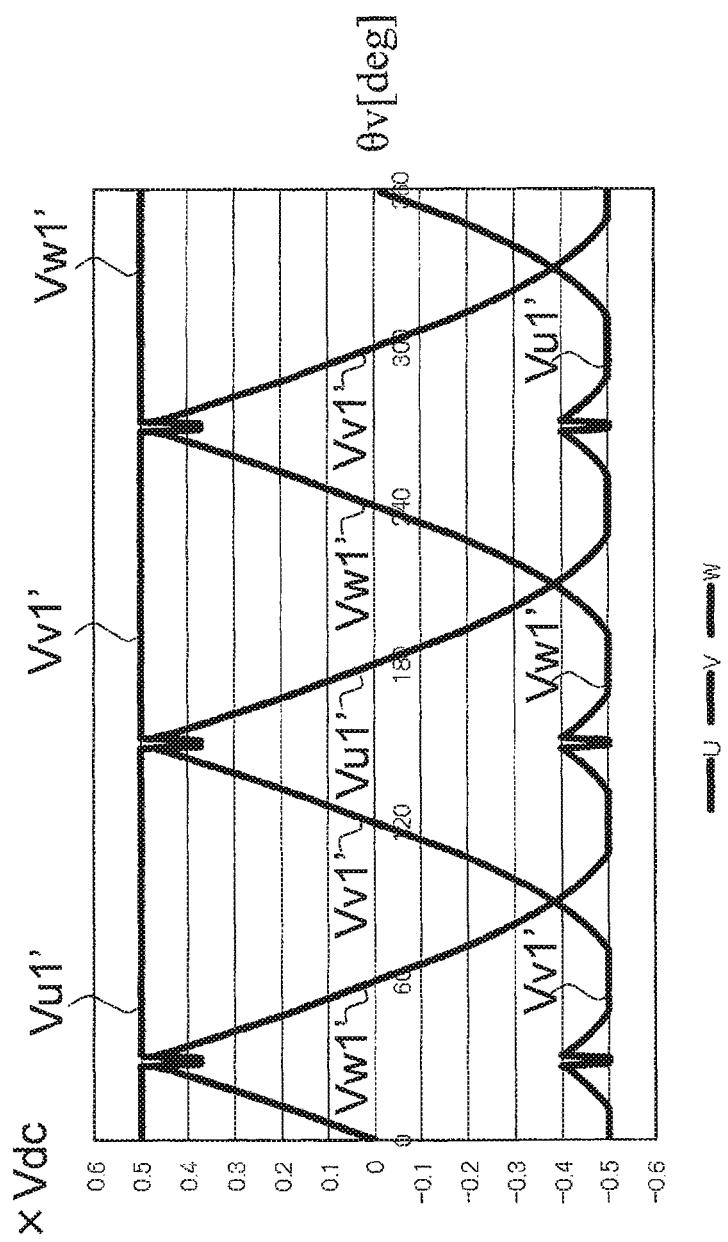
FIG. 13 is a view showing the three-phase applied voltages Vu1', Vv1', Vw1' in a case where the modulation factor is 102%, according to the second embodiment of this invention.

In regions where the modulation factor is no higher than 100%, at least two phases can be detected, and therefore switching noise does not have an effect. However, when the modulation factor is 102%, for example, the current detection precision deteriorates due to the effect of switching noise in the intermediate phase. FIG. 13 is a view showing the three-phase applied voltages Vu1', Vv1', Vw1' in a case where the modulation factor is 102%, according to the second embodiment of this invention.

Hence, a technical feature of the second embodiment is that current detection is performed twice, at a first timing and a second timing, in order to obtain current detection values that are not affected by switching noise even at a high modulation factor.

The current detector 11b shown in FIG. 10 is constituted by the current detection resistance element 9a and the calculator 10b. The current detection resistance element 9a is provided in series with each phase of the low potential side switching elements Sun1, Svn1, Swn1 of the power converter 4a, whereby the calculator 10b detects the currents flowing through the three-phase windings.

More specifically, the calculator 10b detects the currents Iu11, Iv11, Iw11 flowing through the three-phase windings at the first timing ts1, and detects the currents Iu12, Iv12, Iw12 flowing through the three-phase windings at the second timing ts2.

The calculator 10b calculates the detected currents Iu1, Iv1, Iw1 from Iu11, Iv11, Iw11 and Iu12, Iv12, Iw12, which are obtained from the currents flowing through the current detection resistance elements 9a.

In the second embodiment, content implemented by the calculator 10b will be described using a case in which the first timing ts1 is set at 2.4 μs after t2 and the second timing ts2 is set at 2.6 μs before t2, similarly to the first embodiment, as a specific example.

Figure 14:
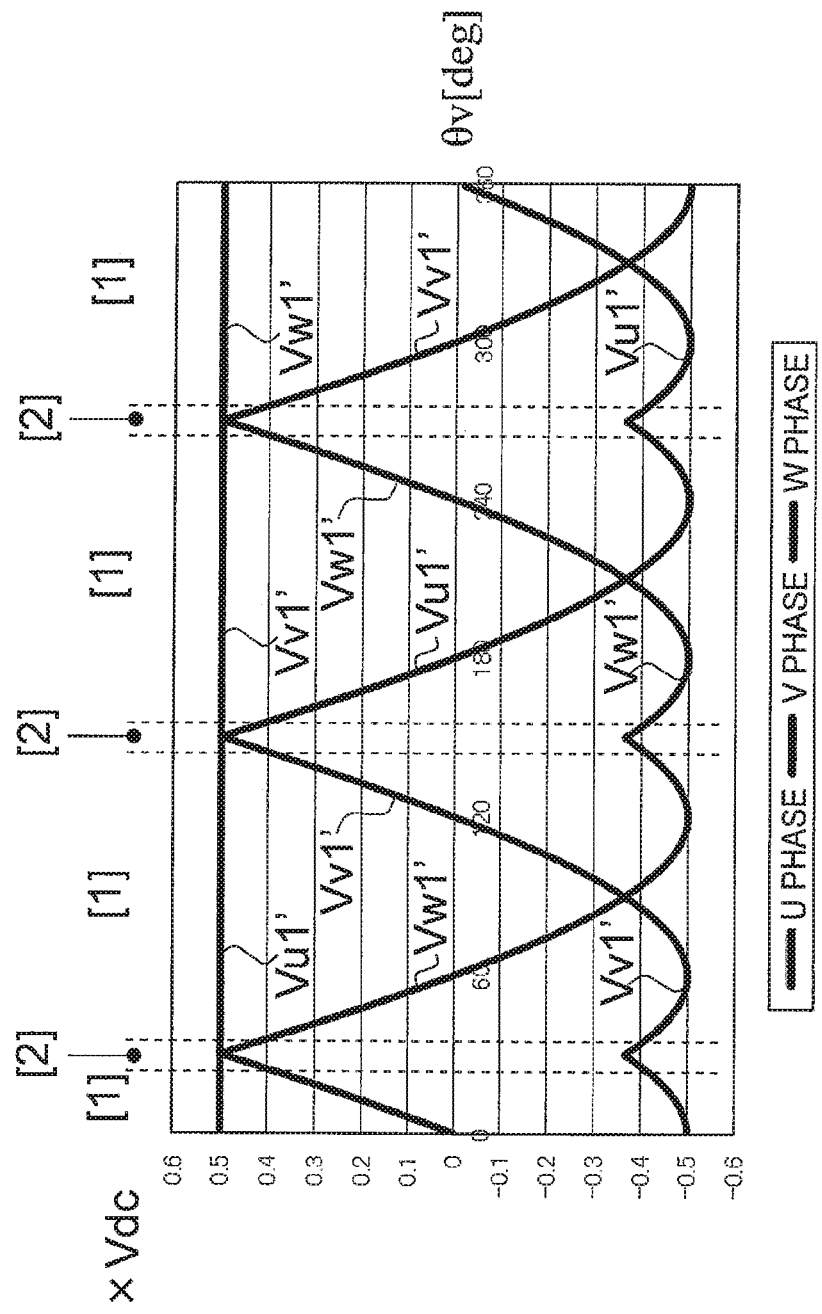
FIG. 14 is a view showing which data, among data obtained at respective timings, are to be used at each electrical angle, the data being selected on the basis of determination results obtained by the calculator according to the second embodiment of this invention.

FIG. 14 is a view showing which data, among the data obtained at the respective timings, are to be used at each electrical angle, the data being selected on the basis of the determination results obtained by the calculator 10b according to the second embodiment of this invention. In FIG. 14, [1] denotes ranges in which the detection results obtained at the first timing ts1 are selected, and [2] denotes ranges in which the detection results obtained at the second timing ts2 are selected.

By employing the current values obtained at the first timing ts1 in a region where the applied voltage of the phase corresponding to the intermediate phase is not within a range of no less than 0.4 Vdc and less than 0.5 Vdc, current detection values that do not include switching noise can be obtained. By employing the detection values obtained at the second timing ts2 in all other regions, current detection values that do not include switching noise can be obtained. As a result, current detection values that are not affected by switching noise can be obtained in all regions.

In other words, by setting the second timing at a different timing to the first timing and a timing at which the low potential side switching element of the minimum phase is ON when one phase, among the applied voltages of the respective phases, equals or exceeds the first predetermined value but is lower than the maximum value of the carrier wave signal, it is possible to obtain an effect not present in the prior art, namely that timings at which detection is impossible can be eliminated.

Figure 15:
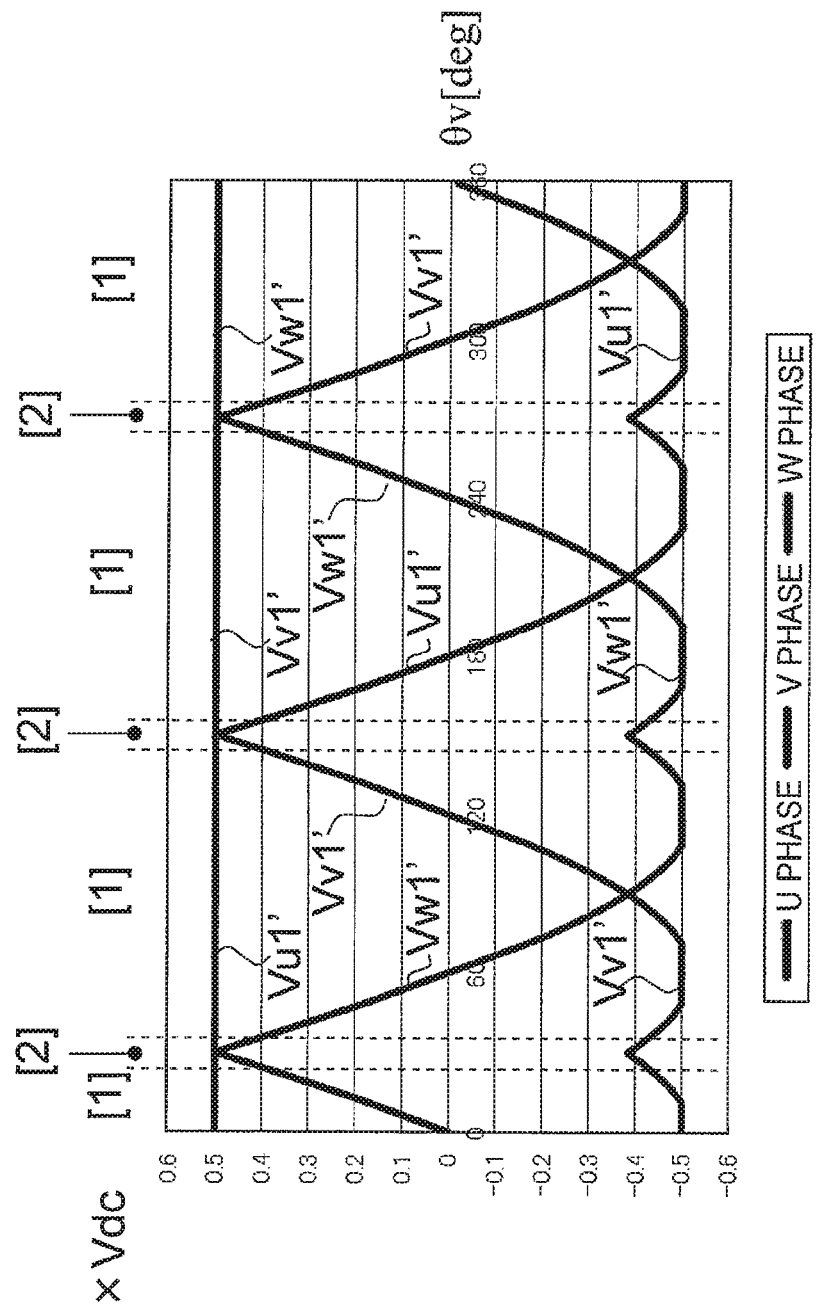
FIG. 15 is a different view showing which data, among the data obtained at the respective timings, are to be used at each electrical angle, the data being selected on the basis of the determination results obtained by the calculator according to the second embodiment of this invention.

Further, FIG. 15 is a different view showing which data, among the data obtained at the respective timings, are to be used at each electrical angle, the data being selected on the basis of the determination results obtained by the calculator 10b according to the second embodiment of this invention, and showing waveforms of the applied voltages when the modulation factor is set at 102%. The applied voltage of the minimum phase in the zones where detection is implemented at the second timing decreases, but switching operations are implemented at a timing further removed from the second timing ts2, and therefore the current detection precision does not deteriorate due to the effect of switching noise even when the modulation factor increases.

Here, three-phase windings were described as an example, but needless to mention, similar effects are obtained with n-phase (where n is a natural number no smaller than 4) windings. More specifically, when n-phase applied voltages are obtained by shifting the voltages of all of the n-phase voltage commands equally such that the voltage of the maximum phase, among the n-phase applied voltage, equals the maximum value of the carrier wave signal, as indicated in the second embodiment, it is possible to obtain a superior effect not present in the prior art, namely that detected currents not including switching noise can be obtained even at a high modulation factor.

Note that the flowchart shown in FIG. 14 for calculating the detected currents Iu1, Iv1, Iw1 in a case where the data obtained at the first timing ts1 are selected is identical to FIG. 7 of the first embodiment.

Figure 16:
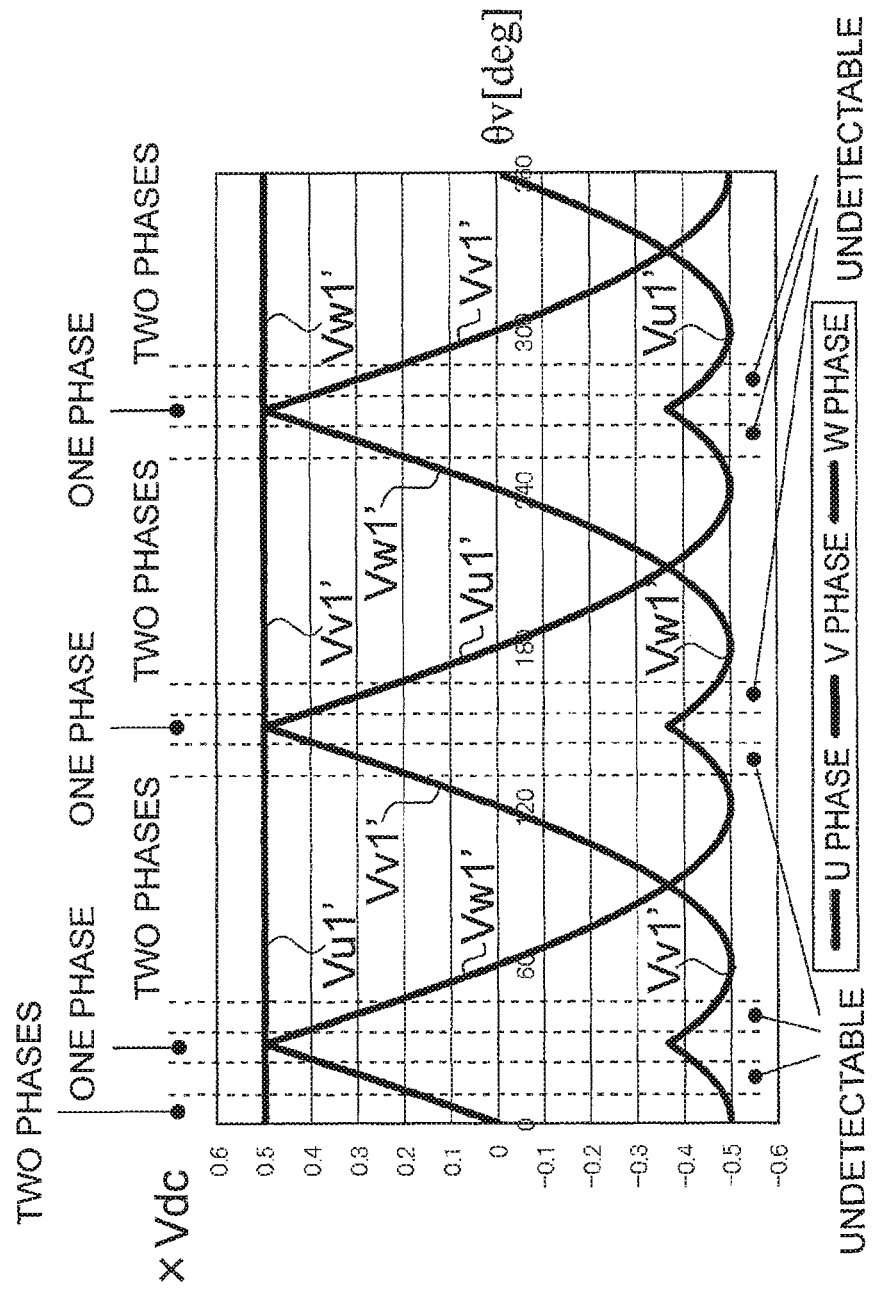
FIG. 16 is a view showing a number of detectable phases relative to respective voltage phases over a single period of a carrier wave signal, according to the second embodiment of this invention.

To ensure that switching noise does not have an effect at the second timing ts2, switching must not be implemented between 2.6 μs and 5 μs prior to the second timing ts2. For this purpose, the applied voltages of the respective phases need to be either lower than 0.196 Vdc or equal to or higher than 0.4 Vdc. FIG. 16 is a view showing a number of detectable phases relative to respective voltage phases over a single period of the carrier wave signal, according to the second embodiment of this invention. As shown in FIG. 16, the number of detectable phases varies over a single period of the carrier wave signal.

The current detection value of one phase, namely the minimum phase, can be obtained in the vicinity of 30 deg, the vicinity of 150 deg, and the vicinity of 270 deg. Current detection values that are not affected by switching noise cannot be obtained in the vicinity of 20 deg, the vicinity of 40 deg, the vicinity of 140 deg, the vicinity of 160 deg, the vicinity of 260 deg, and the vicinity of 280 deg. In all other regions, current detection values of two phases, namely the minimum phase and the intermediate phase, can be obtained. In other words, in the zones of FIG. 14 and FIG. 15 where the data obtained at the second timing are selected, the current detection value of one phase, namely the minimum phase, can be used.

First, a region where θv is in the vicinity of 30 deg will be described. In this region, the current detection value of the V phase is obtained, and therefore the detected current Iv1 of the V phase is set as Iv12. Since the detected current of only one phase is obtained, the currents of the other two phases cannot be calculated using the fact that Iu1+Iv1+Iw1=0.

In this case, therefore, the currents of the remaining two phases may be calculated from Equation (5), shown below, using, for example, previously obtained detected currents of all three phases, the detected current of the single phase obtained at the present time, and an angle variation amount Δθ between the previous operation and the present operation. Note that one of the u phase and the w phase may be calculated from Equation (5), and the remaining phase may be obtained using the fact that Iu1+Iv1+Iw1=0.

$$\begin{cases} i_{w1} = \dfrac{-i_{v1} + \sqrt{3}\, i_{v1\_old}\sin\Delta\theta + (i_{w1\_old} - i_{u1\_old})\cos\Delta\theta}{2} \\ i_{u1} = \dfrac{-i_{v1} - \sqrt{3}\, i_{v1\_old}\sin\Delta\theta - (i_{w1\_old} - i_{u1\_old})\cos\Delta\theta}{2} \end{cases} \quad (5)$$

Here, Iu1_old, Iv1_old, and Iw1_old in Equation (5) respectively denote the detected currents Iu1, Iv1, Iw1 obtained in the past. Further, Δθ denotes angular variation between the time at which Iu1_old, Iv1_old, and Iw1_old were obtained and the present time at which the current of the single phase is detected.

In a region where θv is in the vicinity of 150 deg, the current detection value of the W phase is obtained. Accordingly, the detected current Iw1 of the W phase is set as Iw12. In this region, therefore, the currents of the remaining two phases may be calculated from Equation (6), shown below, using the previously obtained detected currents of the three phases, the detected current of the single phase obtained at the present time, and the angle variation amount Δθ between the previous operation and the present operation. Note that one of the u phase and the v phase may be calculated from Equation (6), and the remaining phase may be obtained using the fact that Iu1+Iv1+Iw1=0.

$$\begin{cases} i_{u1} = \dfrac{-i_{w1} + \sqrt{3}\, i_{w1\_old}\sin\Delta\theta + (i_{u1\_old} - i_{v1\_old})\cos\Delta\theta}{2} \\ i_{v1} = \dfrac{-i_{w1} - \sqrt{3}\, i_{w1\_old}\sin\Delta\theta - (i_{u1\_old} - i_{v1\_old})\cos\Delta\theta}{2} \end{cases} \quad (6)$$

In a region where θv is in the vicinity of 270 deg, the current detection value of the U phase is obtained. Accordingly, the detected current Iu1 of the U phase is set as Iu12. In this region, therefore, the currents of the remaining two phases may be calculated from Equation (7), shown below, using the previously obtained detected currents of the three phases, the detected current of the single phase obtained at the present time, and the angle variation amount Δθ between the previous operation and the present operation. Note that one of the v phase and the w phase may be calculated from Equation (7), and the remaining phase may be obtained using the fact that Iu1+Iv1+Iw1=0.

$$\begin{cases} i_{v1} = \dfrac{-i_{u1} + \sqrt{3}\, i_{u1\_old}\sin\Delta\theta + (i_{v1\_old} - i_{w1\_old})\cos\Delta\theta}{2} \\ i_{w1} = \dfrac{-i_{u1} - \sqrt{3}\, i_{u1\_old}\sin\Delta\theta - (i_{v1\_old} - i_{w1\_old})\cos\Delta\theta}{2} \end{cases} \quad (7)$$

Note that with regard to SIN Δθ and COS Δθ, similar effects may of course be obtained by employing a formula approximated by a Taylor-expanded polynomial of Δθ. Furthermore, although a three-phase winding was described here as an example, similar effects may of course be obtained with n-phase (where n is a natural number no smaller than 4) windings.

As described above, when (n−1) phases of the n phases are undetectable, the detected currents of the undetectable (n−1) phases can be calculated on the basis of the detected current of the single detectable phase obtained at the present time, the detected currents of the n phases obtained in the past, and the angle variation amount from the past to the present. As a result, it is possible to obtain an effect not present in the prior art, namely that a region in which open loop control is required can be reduced.

Third Embodiment

Figure 17:
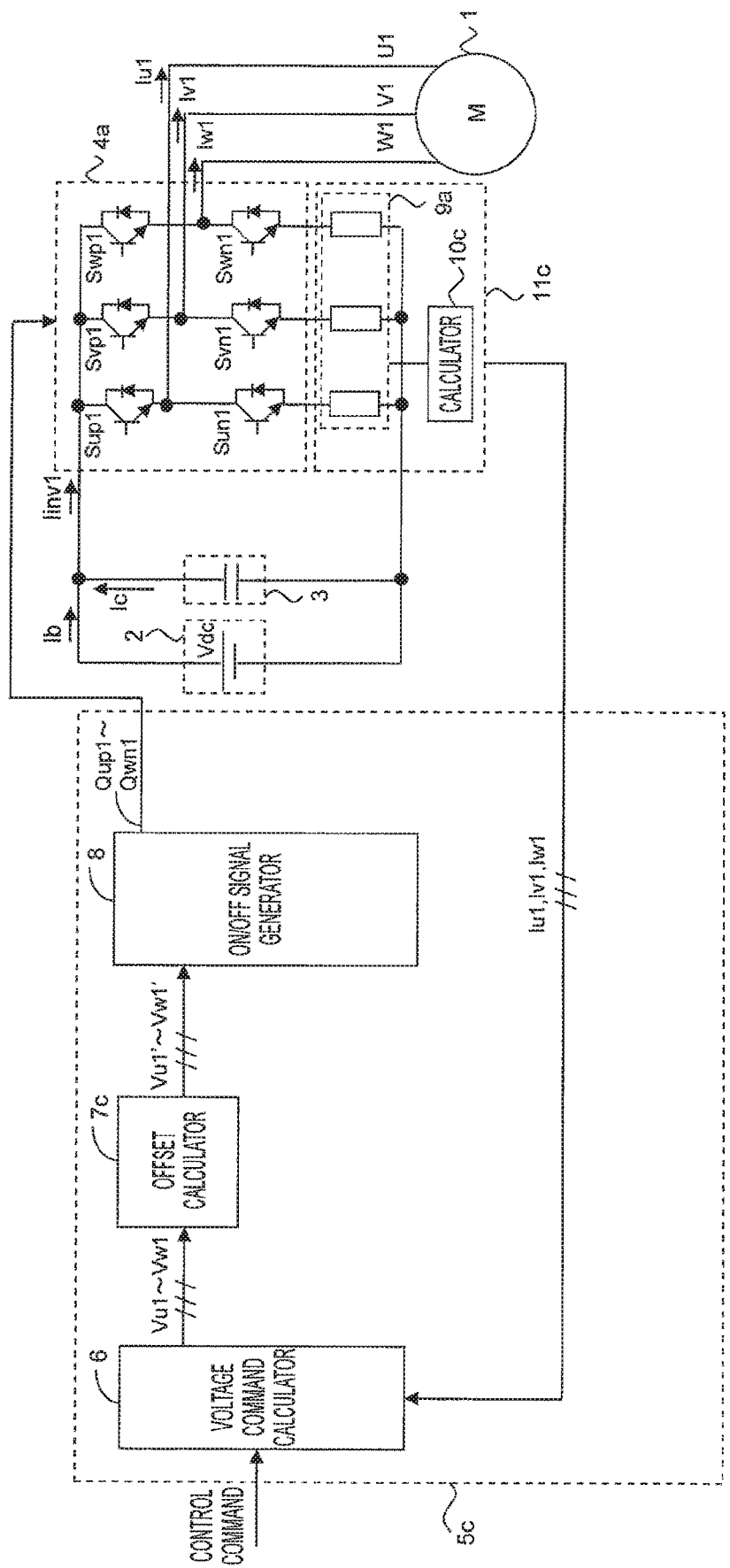
FIG. 17 is a view showing an overall configuration of a power conversion device according to a third embodiment of this invention.

FIG. 17 is a view showing an overall configuration of a power conversion device according to a third embodiment of this invention. The configuration of the third embodiment, shown in FIG. 17, differs from the configuration of the second embodiment, shown in FIG. 10, in relation to a calculator 10c and a current detector 11c. Accordingly, the following description will center on these differences. Note that likewise in the third embodiment, a case in which Tc is set at 50 μs and ti is set at 5 μs will be described as an example.

In the third embodiment, content implemented by the calculator 10c will be described using a case in which the first timing ts1 is set at 2.4 μs after t2 and the second timing ts2 is set at 2.6 μs before t2, similarly to the first and second embodiments, as a specific example. The timings at which the currents are detected at the first timing and the second timing differ by 5 μs, and as a result, errors occur in the current detection values.

From a macro-perspective, the detected currents Iu1, Iv1, Iw1 of the three phases are electrical angle first order sinusoidal waves. In actuality, however, the detected currents Iu1, Iv1, Iw1 are realized by a 20 kHz PWM signal, and therefore the detected currents Iu1, Iv1, Iw1 of the three phases are sinusoidal waves including a 20 kHz harmonic ripple. In other words, the current detection values obtained at the first timing differ from the current detection values obtained at the second timing due to this 20 kHz harmonic ripple component, even when the current detection values are obtained in the same condition.

As shown in FIG. 14, therefore, although the detected currents are obtained from the current detection values obtained at the first timing in most regions, cases in which the detected currents are obtained from the current detection values obtained at the second timing occur three times over a single electrical angle period. If the current detection values obtained at the second timing are used as is at this time, an electrical angle third order current ripple is generated due to an error caused by the difference between the detection timings.

Figure 18:
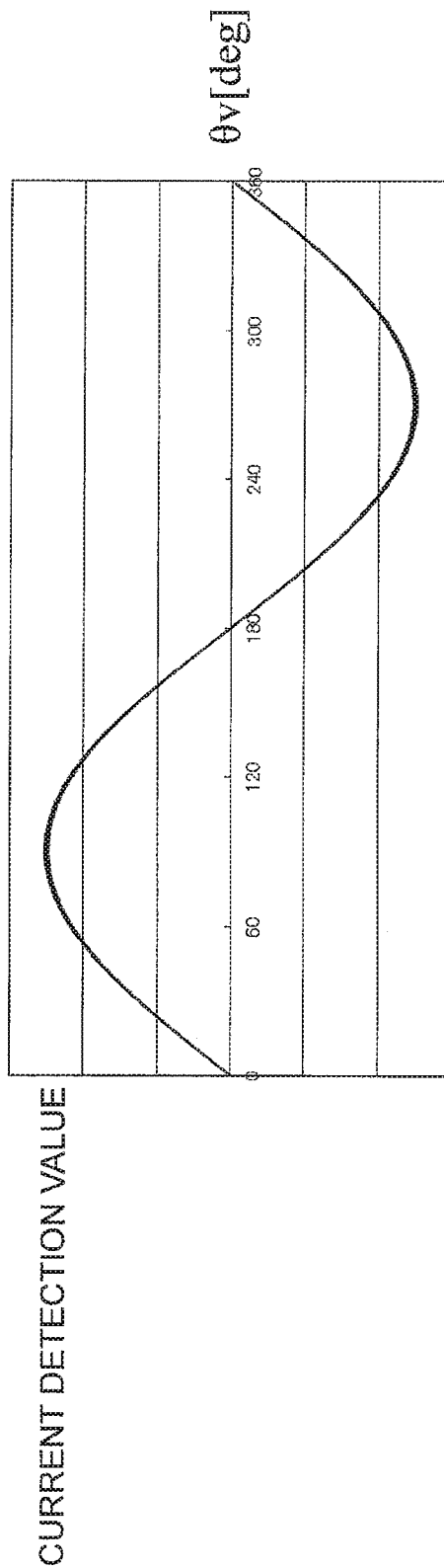
FIG. 18 is a view showing a current detection value over a single electrical angle period in a case where an AC rotary machine performs fixed rotation in response to a certain control command, according to the third embodiment of this invention.
Figure 19:
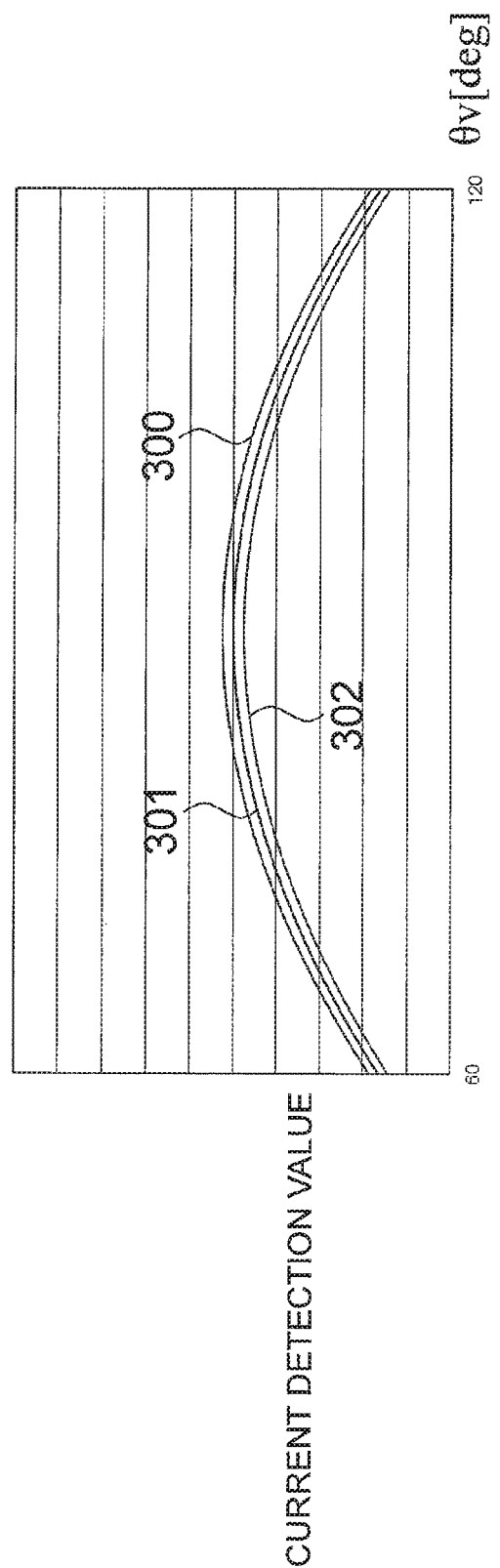
FIG. 19 is a view showing the current detection value within an electrical angle range of 60 deg in a case where the AC rotary machine performs fixed rotation in response to a certain control command, according to the third embodiment of this invention.

FIG. 18 is a view showing a current detection value over a single electrical angle period in a case where the AC rotary machine performs fixed rotation in response to a certain control command, according to the third embodiment of this invention. Further, FIG. 19 is a view showing the current detection value within an electrical angle range of 60 deg in a case where the AC rotary machine performs fixed rotation in response to a certain control command, according to the third embodiment of this invention. More specifically, FIG. 19 shows an enlargement of a zone extending from 60 deg to 120 deg in FIG. 18.

In FIG. 19, lines 300 to 302 denote the following.
Line 300: the waveform of the current detection value when detected Tofs1 (µs) before the center of a single period of the carrier wave signal.
Line 301: the waveform of the current detection value when detected in the center of a single period of the carrier wave signal.
Line 302: the waveform of the current detection value when detected Tofs2 (µs) after the center of a single period of the carrier wave signal.

When a fundamental wave amplitude of the three-phase currents is Ia, Iu11 and Iu12 are as shown below in Equation (8). Here, a variable K is a parameter determined in accordance with specifications and a load voltage of the AC rotary machine.

$$\begin{cases} Iu11 = Ia(1 + Tofs1K)\sin(\theta v) \\ Iu12 = Ia(1 - Tofs2K)\sin(\theta v) \end{cases} \quad (8)$$

In other words, due to a difference between 1+Tots1K and 1−Tofs2K, a difference occurs between the current detection values obtained at the first timing and the current detection values obtained at the second timing. Therefore, when a reference timing is set in the center of a single period of the carrier wave signal, for example, Iu11 and Iu12 are to be corrected to Iu11' and Iu12', as shown below in Equation (9).

$$\begin{cases} Iu11' = Iu11/(1 + Tofs1K) \\ Iu12' = Iu12/(1 - Tofs2K) \end{cases} \quad (9)$$

Likewise with regard to the V phase and the W phase, in the V phase, Iv11 and Iv12 are to be corrected to Iv11' and Iv12', as shown below in Equation (10), and in the W phase, Iw11 and Iw12 are to be corrected to Iw11' and Iw12', as shown below in Equation (11).

$$\begin{aligned} Iv11' &= Iv11/(1 + Tofs1K) \\ Iv12' &= Iv12/(1 - Tofs2K) \end{aligned} \quad (10)$$

$$\begin{aligned} Iw11' &= Iw11/(1 + Tofs1K) \\ Iw12' &= Iw12/(1 - Tofs2K) \end{aligned} \quad (11)$$

The calculator 10c corrects the current detection values to values corresponding to current detection values obtained at the reference timing on the basis of Equations (9) to (11), and then calculates the currents Iu1, Iv1, Iw1 using Iu11', Iu12', Iv11', Iv12', Iw11', and Iw12'. Note that K may be simplified to a constant, or when detailed alignment is required, K may be set as a variable corresponding to conditions such as the rotation speed, the load voltage, and specification variation.

In all of Equations (9) to (11), the current detection values can be corrected to values corresponding to current detection values obtained at the reference timing on the basis of coefficients that are proportional to the time difference Tofs1 between the reference timing and the first timing and the time difference Tofs2 between the reference timing and the second timing.

By implementing this correction on the two sets of current detection values obtained at different timings, and using the two sets of current detection values aligned with the reference timing, it is possible to obtain an effect not present in the prior art, namely that a ripple generated at an integral multiple of an electrical angle frequency can be suppressed. Note that the correction coefficients Tofs1K and Tofs2K are smaller than 1, and therefore similar effects can be obtained using Equation (12).

$$\begin{cases} Iu11' \approx Iu11 \times /(1 - Tofs1K) \\ Iu12' \approx Iu12 \times /(1 + Tofs2K) \\ Iv11' \approx Iv11 \times /(1 - Tofs1K) \\ Iv12' \approx Iv12 \times /(1 + Tofs2K) \\ Iw11' \approx Iw11 \times /(1 - Tofs1K) \\ Iw12' \approx Iw12 \times /(1 + Tofs2K) \end{cases} \quad (12)$$

In the above description, the calculator 10c implements the correction using the center of the carrier wave signal as the reference timing. When, on the other hand, a calculator 10d that corrects the detected current values obtained at the second timing using the first timing as the reference timing is applied, the correction formula is as shown below in Equation (13).

$$\begin{cases} Iu12' = Iu12 \times (1 + Tofs1K)/(1 - Tofs2K) \\ Iv12' = Iv12 \times (1 + Tofs1K)/(1 - Tofs2K) \\ Iw12' = Iw12 \times (1 + Tofs1K)/(1 - Tofs2K) \end{cases} \quad (13)$$

When the current detection values obtained at the second timing are used, the calculator 10d corrects the current detection values to values corresponding to the current detection values obtained at the first timing on the basis of Equation (13), and then calculates the currents Iu1, Iv1, Iw1 using Iu11, Iu12', Iv11, Iv12', Iw11, and Iw12'. Note that K may be simplified to a constant, or when detailed alignment is required, K may be set as a variable corresponding to conditions such as the rotation speed, the load voltage, and specification variation.

As shown in FIG. 14, the current detection values obtained at the first timing are used in most regions. Therefore, by setting the first timing as the reference timing and correcting the current detection values obtained at the second timing to values corresponding to the current detection values obtained at the first timing using Equation (13), it is possible to obtain an effect of reducing the frequency of correction within a single electrical angle period. Note that since the correction coefficients Tofs1K and Tofs2K are smaller than 1, similar effects can be obtained using Equation (14), shown below.

$$\begin{cases} Iu12' = Iu12 \times (1 + Tofs1K + Tofs2K) \\ Iv12' = Iv12 \times (1 + Tofs1K + Tofs2K) \\ Iw12' = Iw12 \times (1 + Tofs1K + Tofs2K) \end{cases} \quad (14)$$

Fourth Embodiment

In the third embodiment, a case in which the detected currents are calculated after implementing a correction to align the current detection values with the reference timing using a correction formula employing preset correction coefficients was described. In a fourth embodiment, on the other hand, a case in which the correction is implemented after calculating a correction amount corresponding to the condition of the actual machine online will be described.

As shown in FIG. 16, a zone in which the current detection values of two phases can be obtained at the second timing exists within a single electrical angle period. As is evident from FIG. 14, in this zone, the current detection values of two phases can also be detected at the first timing.

Correction processing according to the fourth embodiment will now be described specifically, using a region extending from 50 deg to 130 deg as an example. In this region, Iv11, Iw11, Iv12, and Iw12 can be detected. The fundamental waves of the three-phase currents are assumed to be equal, and therefore Equation (15), shown below, is established.

$$\begin{cases} Iv11 = Ia(1 + Tofs1K) \times \sin(\theta v - 2/3\pi) \\ Iv12 = Ia(1 - Tofs2K) \times \sin(\theta v - 2/3\pi) \\ Iw12 = Ia(1 + Tofs1K) \times \sin(\theta v + 2/3\pi) \\ Iw12 = Ia(1 - Tofs2K) \times \sin(\theta v + 2/3\pi) \end{cases} \quad (15)$$

When the three-phase applied voltages and the phases of the three-phase currents are equal, Iv1 and Iw1 reach −Ia and 0, respectively, at 30 deg, and reach 0 and −Ia, respectively, at 150 deg. In consideration of the S/N ratio, the correction precision can be improved to a greater extent by determining the correction coefficients on the basis of the signal having the greatest amplitude, among the detectable phases.

Hence, in an electrical angle region extending from 50 deg to 90 deg, a calculator 10e according to the fourth embodiment calculates (1+Tofs1K)/(1−Tofs2K) on the basis of a relationship between Iv11 and Iv12 using Equation (16), shown below. In other electrical angle regions, the calculator 10e can determine the correction coefficients in a similar manner.

$$(1+Tofs1K)/(1-Tofs2K)=Iv11/Iv12 \quad (16)$$

Further, in an electrical angle region extending from 90 deg to 130 deg, the calculator 10e calculates (1+Tofs1K)/(1−Tofs2K) on the basis of a relationship between Iw11 and Iw12 using Equation (17), shown below.

$$(1+Tofs1K)/(1-Tofs2K)=Iw11/Iw12 \quad (17)$$

In other words, the calculator 10e can obtain the correction coefficients (1+Tofs1K)/(1−Tofs2K) by calculating a ratio of the current detection values obtained at the first timing to the current detection values obtained at the second timing. Moreover, the calculator 10e can use the correction coefficients to correct the current detection values obtained at the second timing to values corresponding to the current detection values obtained at the first timing, as shown in Equation (13). Hence, by providing the calculator 10e according to the fourth embodiment, it is possible to obtain a superior effect not present in the prior art, namely that an error caused by a timing difference can be reduced by finely adjusting the correction amount online.

Here, a method of setting the first timing as the reference timing and correcting the current detection values obtained at the second timing to values corresponding to the current detection values obtained at the first timing was described, but the center of a single period of the carrier wave signal may be set as the reference timing instead.

In consideration of the fact that the correction coefficients Tofs1K and Tofs2K are smaller than 1, Equation (16) may be rewritten as Equation (18), shown below, in which a variable K that is multiplied by the times of the detection timings can be calculated.

$$K=(Iv11/Iv12-1)/(Tofs1+Tofs2) \quad (18)$$

The correction coefficients are obtained from the time difference Tofs1 of the first timing, the time difference Tofs2 between the reference timing and the second timing, and the variable K obtained from Equation (18).

In other words, the calculator 10e can obtain the coefficient K that is multiplied by the time difference Tofs1 of the first timing and the time difference Tofs2 between the reference timing and the second timing by calculating the ratio of the current detection values obtained at the first timing to the current detection values obtained at the second timing.

Moreover, using the correction coefficients obtained by multiplying the variable K by the time difference Tofs1 of the first timing and the time difference Tofs2 between the reference timing and the second timing, the calculator 10e can correct the current detection values obtained at the first timing and the current detection values obtained at the second timing to values corresponding to current detection values obtained at the reference timing, as shown in Equations (9) to (11) or (12).

Hence, by providing the calculator 10e according to the fourth embodiment, it is possible to obtain a superior effect not present in the prior art, namely that an error caused by a timing difference can be reduced by finely adjusting the correction amount online.

Here, a case in which the correction coefficients are determined on the basis of the signal having the larger amplitude was described, but the correction coefficients may also be determined using a plurality of detectable current detection values. In this case also, it is possible to obtain a superior effect not present in the prior art, namely that an error caused by a timing difference can be reduced by finely adjusting the correction amount online.

Fifth Embodiment

In the fourth embodiment, a case in which an error caused by a timing difference is reduced by calculating the correction coefficients (1+Tofs1K)/(1−Tofs2K) or the coefficient K online using Equation (13) was described. In a fifth embodiment, on the other hand, a case in which correction is implemented using a different method to the fourth embodiment will be described.

The U phase current at $\theta v$ and $\theta v+\delta$ is given by Equation (19), shown below.

$$\begin{cases} Iu11(\theta v) = Ia(1 + Tofs1K) \times \sin(\theta v) \\ Iu12(\theta v) = Ia(1 - Tofs2K) \times \sin(\theta v) \\ Iu11(\theta v + \delta) = Ia(1 + Tofs1K) \times \sin(\theta v + \delta) \\ Iu12(\theta v + \delta) = Ia(1 - Tofs2K) \times \sin(\theta v + \delta) \end{cases} \quad (19)$$

From the relationships shown in Equation (19), Equation (20), shown below, is obtained.

$$\begin{cases} Iu11(\theta v) - Iu12(\theta v) = Ia(Tofs1K + Tofs2K)\sin(\theta v) \\ Iu11(\theta v + \delta) - Iu12(\theta v + \delta) = Ia(Tofs1K + Tofs2K)\sin(\theta v + \delta) \end{cases} \quad (20)$$

When the angle variation amount $\delta$ is small and the difference between sin ($\theta v+\delta$) and sin ($\theta v$) is assumed to be minute, Equation (20) can be transformed to Equation (21), shown below.

$$Iu11(\theta v+\delta) \approx Iu12(\theta v+\delta) + Iu11(\theta v) - Iu12(\theta v) \quad (21)$$

In other words, to correct Iu12 detected at the present time to a value corresponding to the current detection value obtained at the first timing, where the most recent values obtained when the U phase current was detectable at both the first timing and the second timing are set as Iu11_old and Iu12_old, the calculation of Equation (22), shown below, should be implemented.

$$Iu12' = Iu12 + Iu11\_old - Iu12\_old \quad (22)$$

In so doing, a difference between the most recent past current detection values obtained when detectable at both the first timing and the second timing can be corrected to a value corresponding to the current detection values obtained at the first timing by adding the difference to the current detection values detected at the present time at the second timing. With this correction processing also, it is possible to obtain a superior effect not present in the prior art, namely that an error caused by a timing difference can be reduced by finely adjusting the correction amount online.

Here, a method of setting the first timing as the reference timing and correcting the current detection values obtained at the second timing to values corresponding to the current detection values obtained at the first timing was described, but the center of a single period of the carrier wave signal may be set as the reference timing instead. In this case, the current detection values obtained at the first timing and the current detection values obtained at the second timing can be corrected respectively to values corresponding to current detection values obtained at the reference timing by employing Equation (23), shown below, which is derived from the same concept.

$$\begin{cases} Iu11' = Iu11 - Tofs1(Iu11\_old - Iu12\_old)/(Tofs1 + Tofs2) \\ Iu12' = Iu12 + Tofs2(Iu11\_old - Iu12\_old)/(Tofs1 + Tofs2) \end{cases} \quad (23)$$

Note that although the center of a single period of the carrier wave signal is set as the reference timing, correction may of course be implemented using a similar method when another timing is set as the reference timing. With this correction processing also, it is possible to obtain a superior effect not present in the prior art, namely that an error caused by a timing difference can be reduced by finely adjusting the correction amount online.

Sixth Embodiment

In the first to fifth embodiments, cases in which the control device according to this invention is applied to an AC rotary machine having a single set of windings were described. However, the control device according to this invention may also be applied to an AC rotary machine having a plurality of sets of windings. Hence, in a sixth embodiment, a case in which the control device according to this invention is applied to an AC rotary machine having two sets of three-phase windings with no phase difference will be described. Note that in the sixth embodiment, similarly to the first to fifth embodiments, Tc is set at 50 μs, ti is set at 5 μs, and the first predetermined value is set at 0.4 Vdc.

Figure 20:
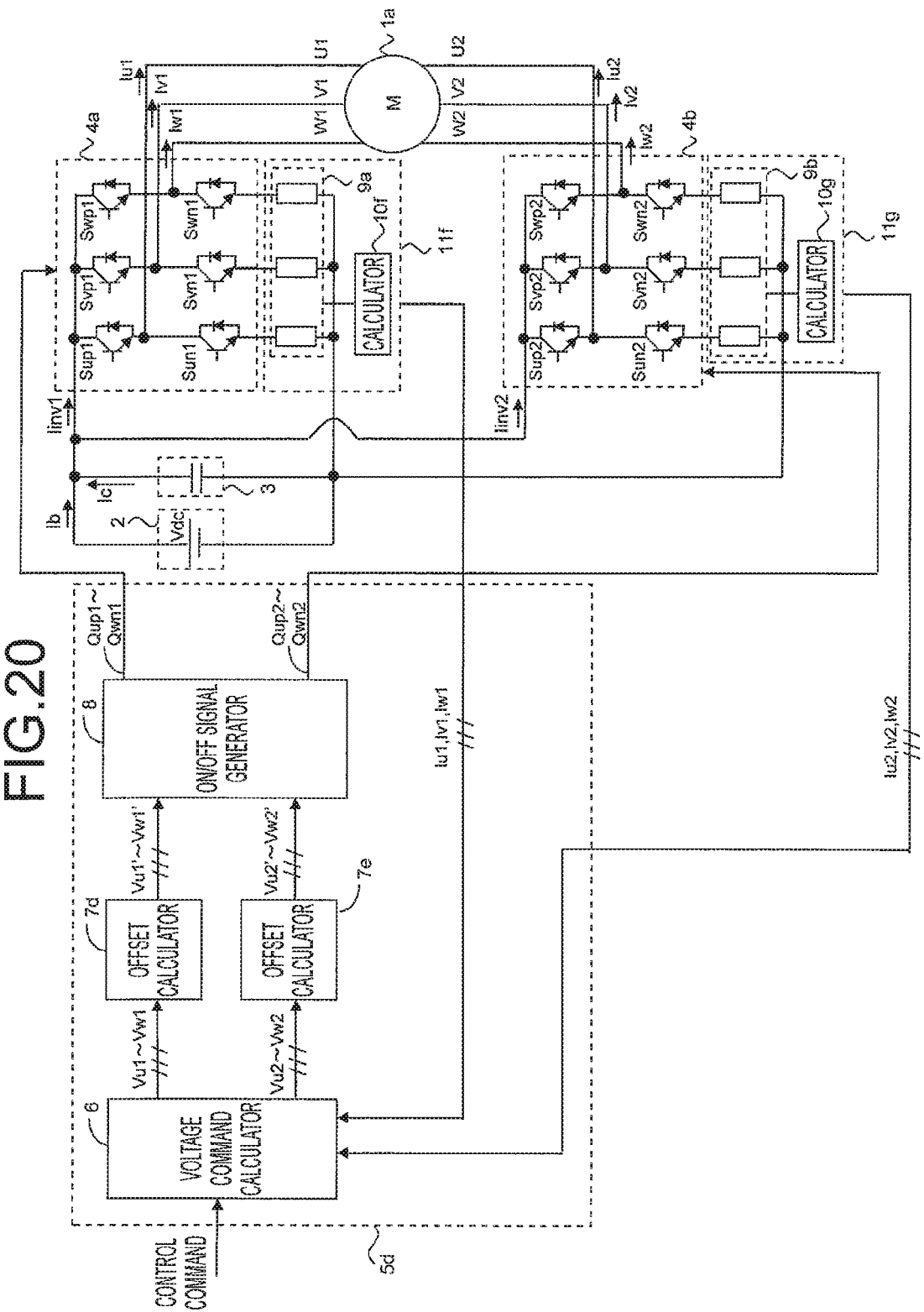
FIG. 20 is a view showing an overall configuration of a power conversion device according to a sixth embodiment of this invention.

FIG. 20 is a view showing an overall configuration of a power conversion device according to the sixth embodiment of this invention. An AC rotary machine 1a is a three-phase AC rotary machine in which first three-phase windings U1, V1, W1 and second three-phase windings U2, V2, W2 are housed in a stator of the rotary machine without being electrically connected to each other.

A permanent magnet synchronous rotary machine, an induction rotary machine, a synchronous reluctance rotary machine, and so on may be cited as examples of this type of three-phase AC rotary machine, and in this invention, any AC rotary machine having two sets of three-phase windings may be used.

The DC power supply 2 outputs the DC voltage Vdc to a first power converter 4a and a second power converter 4b. Any device that outputs a DC voltage, such as a battery, a DC-DC converter, a diode rectifier, or a PWM rectifier, may be used as the DC power supply 2.

The smoothing capacitor 3 is connected in parallel to the DC power supply 2 in order to suppress variation in a bus current and thereby realize a stable direct current. Here, although not shown in detail in the drawings, equivalent series resistance Rc and lead inductance Lc exist in addition to true capacitor capacitance C.

The first power converter 4a uses an inverter circuit, or in other words an inverter, to switch the high potential side switching elements Sup1, Svp1, Swp1 and the low potential side switching elements Sun1, Svn1, Swn1 ON and OFF on the basis of the ON/OFF signals Qup1, Qun1, Qvp1, Qvn1, Qwp1, Qwn1. By switching the switching elements in this manner, the first power converter 4a power-converts the DC voltage Vdc input from the DC power supply 2, and applies the resulting voltage to the three-phase windings U1, V1, W1 of the AC rotary machine 1a. As a result, the currents Iu1, Iv1, Iw1 are passed through the AC rotary machine 1a.

Here, the ON/OFF signals Qup1, Qun1, Qvp1, Qvn1, Qwp1, Qwn1 are ON/OFF signals for switching the switching elements Sup1, Sun1, Svp1, Svn1, Swp1, Swn1, respectively, ON and OFF in the power converter 4a.

It is assumed hereafter that when the ON/OFF signals Qup1, Qun1, Qvp1, Qvn1, Qwp1, Qwn1 have a value of 1, signals for switching the corresponding switches ON are output, and when the ON/OFF signals Qup1, Qun1, Qvp1, Qvn1, Qwp1, Qwn1 have a value of 0, signals for switching the corresponding switches OFF are output.

Note that each of the semiconductor switches Sup1 to Swn1 may be constituted by a semiconductor switch such as an IGBT, a bipolar transistor, or a MOS power transistor, and a diode connected in anti-parallel to the semiconductor switch.

The second power converter 4b uses an inverter circuit, or in other words an inverter, to switch high potential side switching elements Sup2, Svp2, Swp2 and low potential side switching elements Sun2, Svn2, Swn2 ON and OFF on the basis of ON/OFF signals Qup2, Qun2, Qvp2, Qvn2, Qwp2, Qwn2. By switching the switching elements in this manner, the second power converter 4b power-converts the DC voltage Vdc input from the DC power supply 2, and applies the resulting voltage to the three-phase windings U2, V2, W2 of the AC rotary machine 1a. As a result, currents Iu2, Iv2, Iw2 are passed through the AC rotary machine 1a.

Here, the ON/OFF signals Qup2, Qun2, Qvp2, Qvn2, Qwp2, Qwn2 are ON/OFF signals for switching the switching elements Sup2, Sun2, Svp2, Svn2, Swp2, Swn2, respectively, ON and OFF in the second power converter 4b.

It is assumed hereafter that when the ON/OFF signals Qup2, Qun2, Qvp2, Qvn2, Qwp2, Qwn2 have a value of 1, signals for switching the corresponding switches ON are output, and when the ON/OFF signals Qup2, Qun2, Qvp2, Qvn2, Qwp2, Qwn2 have a value of 0, signals for switching the corresponding switches OFF are output.

Note that each of the semiconductor switches Sup2 to Swn2 may be constituted by a semiconductor switch such as an IGBT, a bipolar transistor, or a MOS power transistor, and a diode connected in anti-parallel to the semiconductor switch.

Next, a control unit 5d will be described. The voltage command calculator 6 calculates first three-phase voltage commands Vu1, Vv1, Vw1 and second three-phase voltage commands Vu2, Vv2, Vw2 relating respectively to voltages to be applied to the first three-phase windings and voltages to be applied to the second three-phase windings in order to drive the AC rotary machine 1a, and outputs the calculated voltage commands respectively to offset calculators 7d, 7e.

Current feedback control, in which a current command for the AC rotary machine 1a is set as a control command, whereupon the first three-phase voltage commands Vu1, Vv1, Vw1 are calculated by proportional integral control so as to reduce to zero respective deviations between the control command and the currents Iu1, Iv1, Iw1 flowing through the first three-phase windings, which are detected by a first current detector 11f, and the second three-phase voltage commands Vu2, Vv2, Vw2 are calculated by proportional integral control so as to reduce to zero respective deviations between the control command and the currents Iu2, Iv2, Iw2 flowing through the second three-phase windings, which are detected by a second current detector 11g, or the like may be used as a method of calculating the first three-phase voltage commands Vu1 to Vw1 and the second three-phase voltage commands Vu2 to Vw2. This control method is well-known technology, and therefore detailed description thereof has been omitted.

Figure 21:
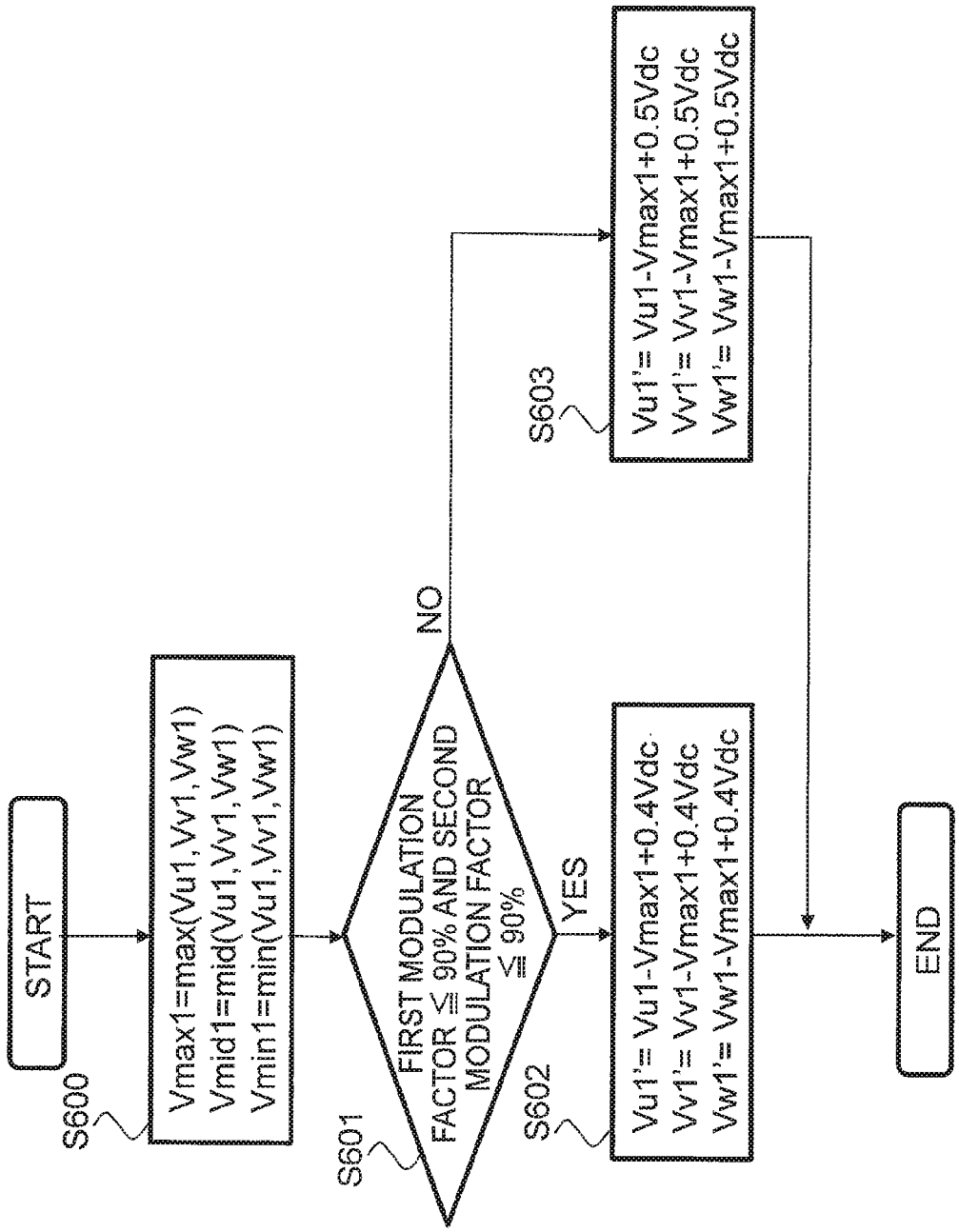
FIG. 21 is a flowchart showing a series of calculation processes executed by an offset calculator according to the sixth embodiment of this invention.

The offset calculator 7d calculates first three-phase applied voltages Vu1', Vv1', Vw1' on the basis of the first three-phase voltage commands Vu1, Vv1, Vw1. FIG. 21 is a flowchart showing a series of calculation processes executed by the offset calculator 7d according to the sixth embodiment of this invention. In step S600, the offset calculator 7d assigns the first three-phase voltage commands Vu1, Vv1, Vw1 in descending order to the first maximum phase Vmax1, the first intermediate phase Vmid1, and the first minimum phase Vmin1.

Next, in step S601, the offset calculator 7d determines whether or not a first modulation factor is equal to or lower than 90% and a second modulation factor is equal to or lower than 90%. When the determination result is affirmative (YES), the offset calculator 7d executes step S602, and when the determination result is negative (NO), the offset calculator 7d executes step S603. Note that the offset calculator 7d may determine whether or not Vmax1−Vmin1≤0.9 Vdc and Vmax2−Vmin2≤0.9 Vdc using a difference between the first maximum phase Vmax1 and the first minimum phase Vmin1 and a difference between a second maximum phase Vmax2 and a second minimum phase Vmin2, to be described below, as illustrated in FIG. 8 of PTL 3.

After advancing to step S602, the offset calculator 7d calculates the first three-phase applied voltages Vu1', Vv1', Vw1' by subtracting the first maximum phase Vmax1 from the voltages of all of the first three-phase voltage commands Vu1, Vv1, Vw1 and adding 0.4 times the DC voltage Vdc thereto. As a result of the calculations implemented in step S602, the first voltage commands Vu1, Vv1, Vw1 are offset such that the voltage of the phase corresponding to the first maximum phase matches 0.4 Vdc.

Here, 0.4 Vdc is equal to the maximum applied voltage at which the phase current detection time can be secured. By executing step S602, therefore, the voltages of all of the first voltage commands Vu1, Vv1, Vw1 are offset such that among the first three-phase applied voltages, the applied voltage of the phase corresponding to the first maximum phase matches the maximum value 0.4 Vdc of the carrier wave signal.

When the offset calculator 7d advances to step S603, on the other hand, either the difference between the first maximum phase Vmax1 and the first minimum phase Vmin1 or the difference between the second maximum phase Vmax2 and the second minimum phase Vmin2 exceeds 0.9 Vdc, and therefore at least one of the set of first three-phase applied voltages and the set of second three-phase applied voltages cannot be kept between −0.5 Vdc and 0.4 Vdc regardless of the voltage by which the voltage commands are offset. In this case, therefore, the first voltage commands Vu1, Vv1, Vw1 are offset by implementing upper solid modulation such that the voltage of the phase corresponding to the first maximum phase matches 0.5 Vdc.

Here, similarly to the examples in PTL 1 and PTL 3, a case in which the phase current detection time is set at 5 μs and 90% is set as the threshold will be described. Note, however, that the threshold of the modulation factor may be designed in accordance with an actual machine in consideration of the ringing settling time included in the detection waveform, the conversion time of the analog/digital converter, the time required for sampling and holding, and so on.

Figure 22:
FIG. 22 is a flowchart showing a series of calculation processes executed by the offset calculator according to the sixth embodiment of this invention.

The offset calculator 7e calculates second three-phase applied voltages Vu2', Vv2', Vw2' on the basis of the second three-phase voltage commands Vu2, Vv2, Vw2. FIG. 22 is a flowchart showing a series of calculation processes executed by the offset calculator 7e according to the sixth embodiment of this invention. In step S610, the offset calculator 7e assigns the second three-phase voltage commands Vu2, Vv2, Vw2 in descending order to the second maximum phase Vmax2, a second intermediate phase Vmid2, and the second minimum phase Vmin2.

Next, in step S611, the offset calculator 7e determines whether or not the first modulation factor is equal to or lower than 90% and the second modulation factor is equal to or lower than 90%. When the determination result is affirmative (YES), the offset calculator 7e executes step S612, and when the determination result is negative (NO), the offset calculator 7e executes step S613. Note that the offset calculator 7e may determine whether or not Vmax1−Vmin1≤0.9 Vdc and Vmax2−Vmin2≤0.9 Vdc using the difference between the first maximum phase Vmax1 and the first minimum phase Vmin1 and the difference between the second maximum phase Vmax2 and the second minimum phase Vmin2, as illustrated in FIG. 8 of PTL 3. However, the offset calculator 7d and the offset calculator 7e preferably employ identical determination methods.

After advancing to step S612, the offset calculator 7e calculates the second three-phase applied voltages Vu2', Vv2', Vw2' by subtracting the second maximum phase Vmax2 from the voltages of all of the second three-phase voltage commands Vu2, Vv2, Vw2 and adding 0.4 times the DC voltage Vdc thereto. As a result of the calculations implemented in step S612, the second voltage commands Vu2, Vv2, Vw2 are offset such that the voltage of the phase corresponding to the second maximum phase matches 0.4 Vdc.

Here, 0.4 Vdc is equal to the maximum applied voltage at which the phase current detection time can be secured. By executing step S612, therefore, the voltages of all of the second voltage commands Vu2, Vv2, Vw2 are offset such that among the second three-phase applied voltages, the applied voltage of the phase corresponding to the second maximum phase matches the maximum value 0.4 Vdc of the carrier wave signal.

When the offset calculator 7e advances to step S613, on the other hand, either the difference between the first maximum phase Vmax1 and the first minimum phase Vmin1 or the difference between the second maximum phase Vmax2 and the second minimum phase Vmin2 exceeds 0.9 Vdc, and therefore at least one of the set of first three-phase applied voltages and the set of second three-phase applied voltages cannot be kept between −0.5 Vdc and 0.4 Vdc regardless of the voltage by which the voltage commands are offset. In this case, therefore, the second voltage commands Vu2, Vv2, Vw2 are offset by implementing upper solid modulation such that the voltage of the phase corresponding to the second maximum phase matches 0.5 Vdc.

Figure 23:
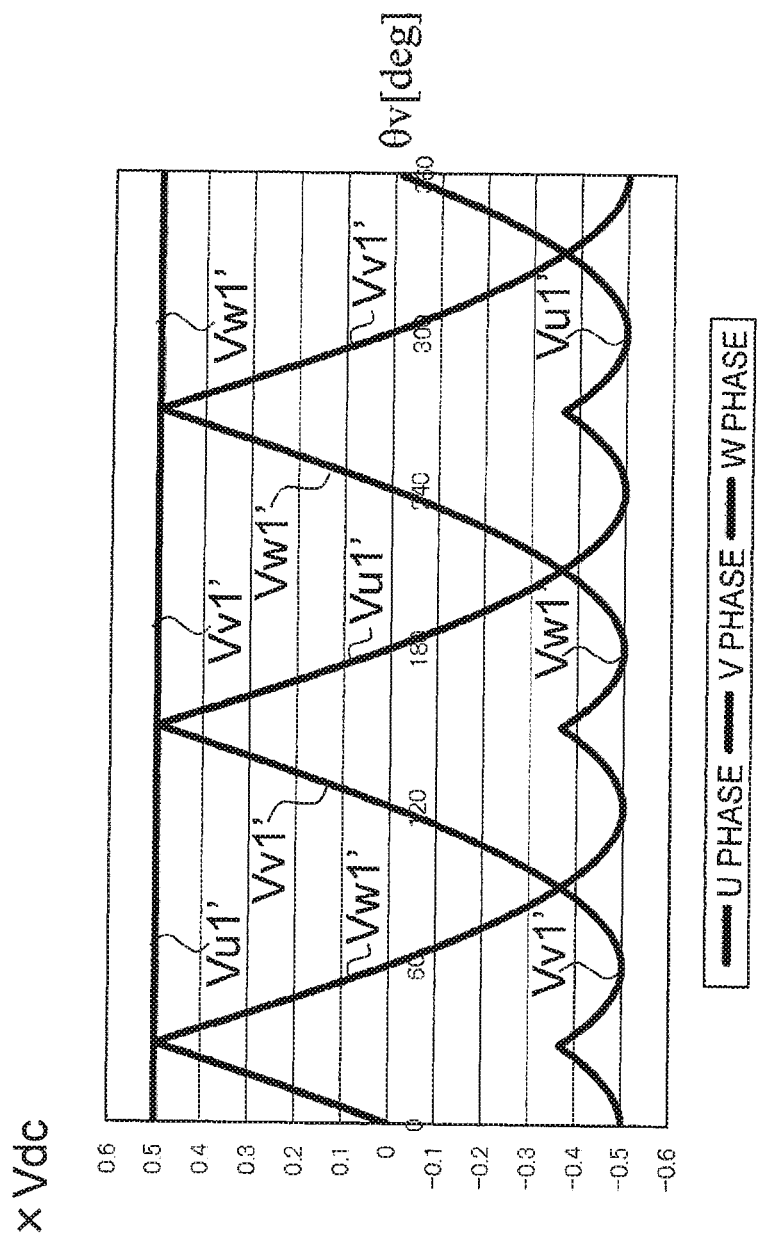
FIG. 23 is a view showing first three-phase applied voltages Vu1', Vv1', Vw1' in a case where the modulation factor is 100%, according to the sixth embodiment of this invention.

FIG. 23 is a view showing the first three-phase applied voltages Vu1', Vv1', Vw1' in a case where the modulation factor is 100%, according to the sixth embodiment of this invention. The abscissa shows the voltage phase θv [deg], and the ordinate shows the ratio to the DC voltage Vdc. The first three-phase voltage commands Vu1, Vv1, Vw1 have sinusoidal waveforms with an amplitude of Vdc/√3, using 0 as a reference.

As shown in FIG. 23, by executing step S603, upper solid modulation is realized such that the applied voltage of the phase corresponding to the first maximum phase remains at 0.5 Vdc at all times, while the applied voltage of the phase corresponding to the first minimum phase reaches −0.5 Vdc at 60 deg intervals.

In FIG. 23, the applied voltage of the phase corresponding to the first intermediate phase exceeds 0.4 Vdc in the vicinity of 30 deg, the vicinity of 150 deg, and the vicinity of 300 deg. Therefore, when upper solid modulation is implemented, the detection precision with which the current detection values are obtained at the first timing deteriorates due to the effect of switching noise generated in the first intermediate phase.

Hence, a technical feature of the sixth embodiment is that current detection is performed twice, at the first timing and the second timing, in relation to the first three-phase windings so that current detection values not affected by switching noise are obtained even when the modulation factor is high.

Figure 24:
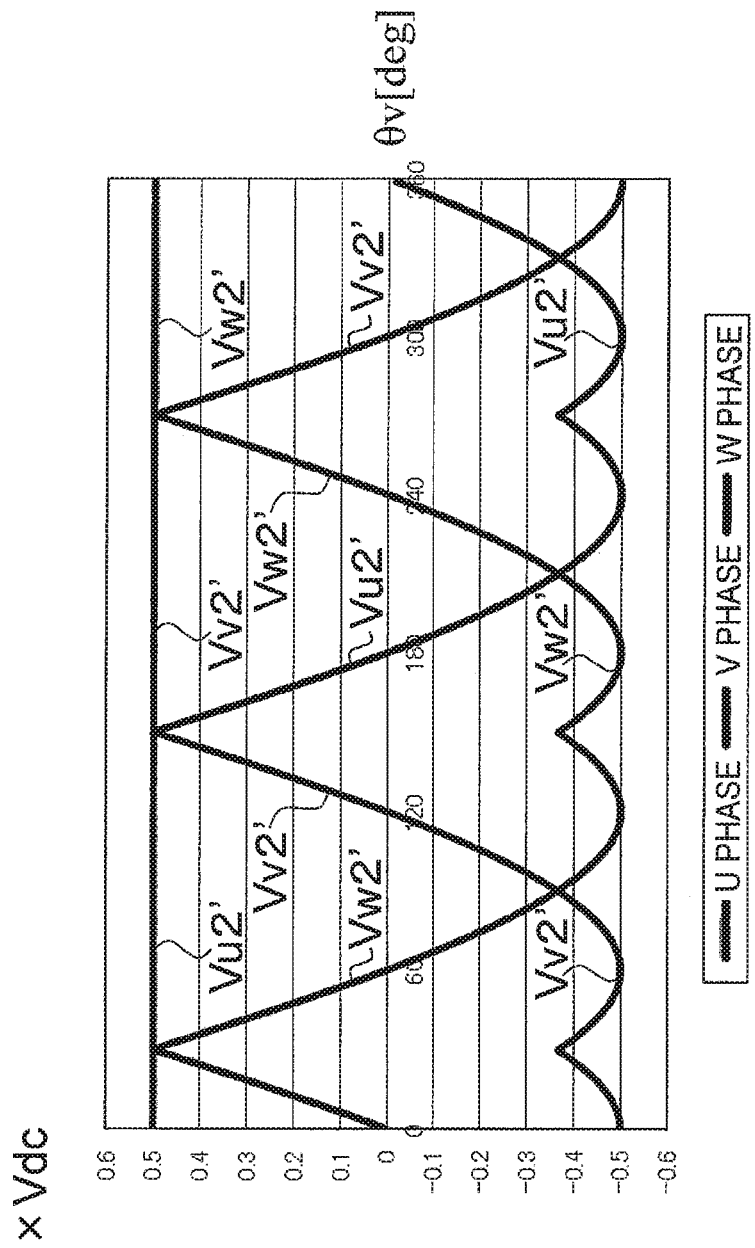
FIG. 24 is a view showing second three-phase applied voltages Vu2', Vv2', Vw2' in a case where the modulation factor is 100%, according to the sixth embodiment of this invention.

FIG. 24 is a view showing the second three-phase applied voltages Vu2', Vv2', Vw2' in a case where the modulation factor is 100%, according to the sixth embodiment of this invention. The abscissa shows the voltage phase θv [deg], and the ordinate shows the ratio to the DC voltage Vdc. The second three-phase voltage commands Vu2, Vv2, Vw2 have sinusoidal waveforms with an amplitude of Vdc/√3, using 0 as a reference.

As shown in FIG. 24, by executing step S613, upper solid modulation is realized such that the applied voltage of the phase corresponding to the second maximum phase remains at 0.5 Vdc at all times, while the applied voltage of the phase corresponding to the second minimum phase reaches −0.5 Vdc at 60 deg intervals.

In FIG. 24, the applied voltage of the phase corresponding to the second intermediate phase exceeds 0.4 Vdc in the vicinity of 30 deg, the vicinity of 150 deg, and the vicinity of 300 deg. Therefore, when upper solid modulation is implemented, the detection precision with which the current detection values are obtained at the first timing deteriorates due to the effect of switching noise generated in the second intermediate phase.

Hence, a technical feature of the sixth embodiment is that current detection is performed twice, at the first timing and the second timing, in relation to the second three-phase windings so that current detection values not affected by switching noise are obtained even when the modulation factor is high.

The ON/OFF signal generator 8 outputs the ON/OFF signals Qup1, Qun1, Qvp1, Qvn1, Qwp1, Qwn1 on the basis of the first three-phase applied voltages Vu1', Vv1', Vw1', and outputs the ON/OFF signals Qup2, Qun2, Qvp2, Qvn2, Qwp2, Qwn2 on the basis of the second three-phase applied voltages Vu2', Vv2', Vw2'. This content is identical to the first embodiment, described using FIG. 4, and therefore detailed description thereof has been omitted.

A first current detector 11f is constituted by the first current detection resistance element 9a and a calculator 10f. The first current detection resistance element 9a is provided in series with each phase of the low potential side switching elements Sun1, Svn1, Swn1 of the first power converter 4a, whereby the calculator 10f detects the currents flowing through the first three-phase windings.

More specifically, the calculator 10f detects currents Iu11, Iv11, Iw11 flowing through the first three-phase windings at the first timing ts1, and detects currents Iu12, Iv12, Iw12 flowing through the first three-phase windings at the second timing ts2.

The calculator 10f calculates the detected currents Iu1, Iv1, Iw1 from Iu11, Iv11, Iw11 and Iu12, Iv12, Iw12, obtained from the currents flowing through the first current detection resistance elements 9a.

Note that with respect to the first three-phase windings, the current detection values of two undetectable phases may be estimated from the current detection value of a single phase, as described in the second embodiment. Moreover, the current detection values obtained at the second timing may be corrected to values corresponding to the current detection values obtained at the first timing, as described in the third to fifth embodiments.

A second current detector 11g is constituted by a second current detection resistance element 9b and a calculator 10g. The second current detection resistance element 9b is provided in series with each phase of the low potential side switching elements Sun2, Svn2, Swn2 of the second power converter 4b, whereby the calculator 10g detects the currents flowing through the second three-phase windings.

More specifically, the calculator 10g detects currents Iu21, Iv21, Iw21 flowing through the second three-phase windings at the first timing ts1, and detects currents Iu22, Iv22, Iw22 flowing through the second three-phase windings at the second timing ts2.

The calculator 10g calculates detected currents Iu2, Iv2, Iw2 from Iu21, Iv21, Iw21 and Iu22, Iv22, Iw22, obtained from the currents flowing through the second current detection resistance elements 9b.

Note that with respect to the second three-phase windings, the current detection values of two undetectable phases may be estimated from the current detection value of a single phase, as described in the second embodiment. Moreover, the current detection values obtained at the second timing may be corrected to values corresponding to the current detection values obtained at the first timing, as described in the third to fifth embodiments.

A method of setting the first timing ts1 and the second timing ts2 according to the sixth embodiment when controlling an AC rotary machine having two sets of three-phase windings with no phase difference will now be described.

Similarly to a case in which one set of windings is provided, the first timing ts1 may be set at a timing where the low potential side switching elements of the respective phases other than the first maximum phase and the second maximum phase are all switched ON when the first three-phase applied voltages and the second three-phase applied voltages are lower than the first predetermined value or at the maximum value of the carrier wave signal. For example, the first timing ts1 may be set 2.4 μs after the center of a single period of the carrier wave signal.

The second timing ts2 is to be used when the currents cannot be detected at the first timing ts1, and should therefore be set at a timing other than the timing described above where effective current detection values can be obtained. In FIG. 23 and FIG. 24, the first three-phase applied voltages and the second three-phase applied voltages all have the same waveform. In an actual machine, however, a phase difference or an amplitude difference exists between the first three-phase applied voltages and the second three-phase applied voltages due to differences in the specifications of the first three-phase windings and circuits and the second three-phase windings and circuits.

Figure 25:
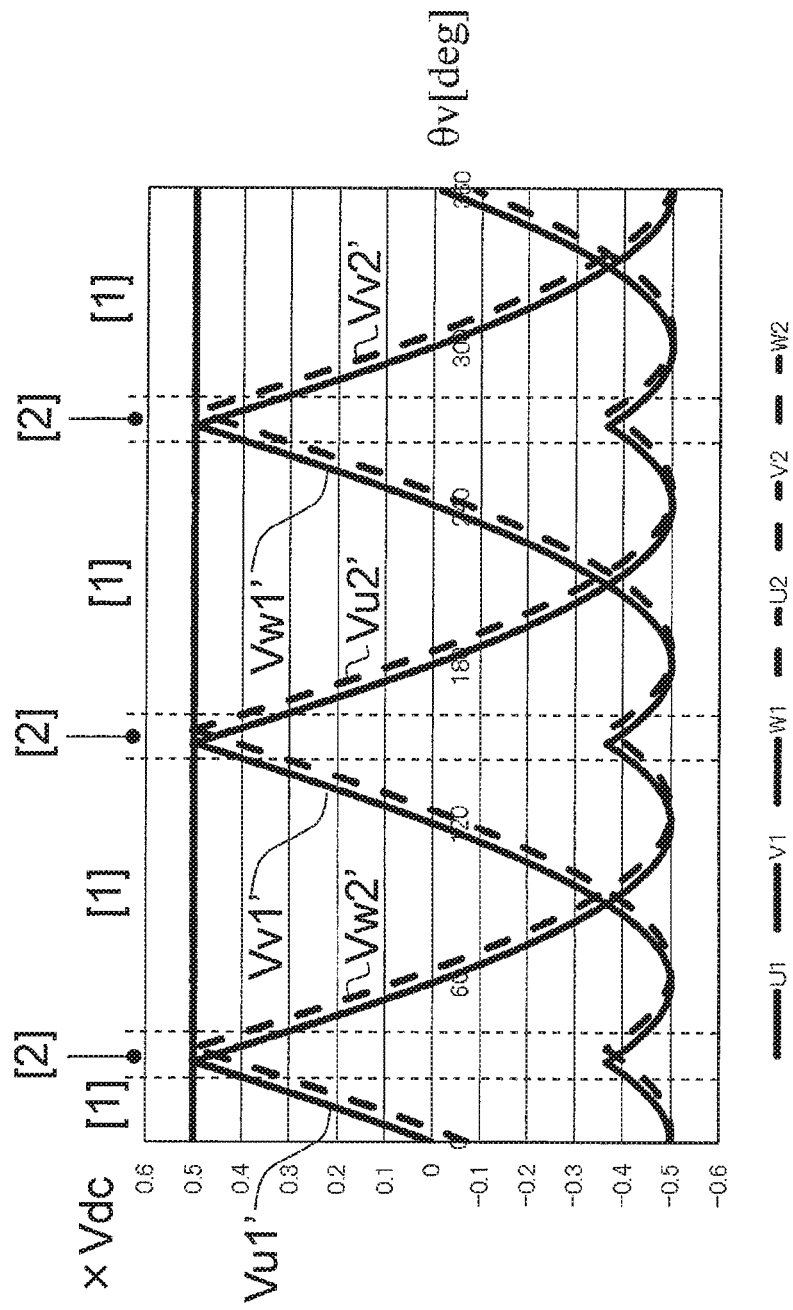
FIG. 25 is a view showing waveforms in a case where a phase difference exists between the first three-phase applied voltages and the second three-phase applied voltages, according to the sixth embodiment of this invention.

FIG. 25 is a view showing waveforms in a case where a phase difference exists between the first three-phase applied voltages and the second three-phase applied voltages, according to the sixth embodiment of this invention. The number of electrical angle regions in which currents can be detected at the first timing ts1 is smaller than in FIG. 14 due to the effect of the phase difference between the three-phase applied voltages.

A case in which the second timing is set 2.6 μs before the center of a single period of the carrier wave signal, as illustrated in FIG. 14, will now be considered. In this case, the current detection values obtained by the first current detection resistance elements 9a are not affected by switching noise generated by the first three-phase applied voltages, but are affected by switching noise generated by the second three-phase applied voltages. As a result, the current detection precision deteriorates.

Hence, ts2 should be set so as to satisfy Equation (24), shown below, where Vmid_min denotes a minimum value of the first intermediate phase and the second intermediate phase in a region where the second timing is used.

$$ts2 >= Tc(0.5Vdc - Vmid\_min)/Vdc/2 \quad (24)$$

In the case shown in FIG. 25, Vmid_min is 0.3 Vdc, and ts2 is at least 5 μs. Therefore, the second timing should be set at least 5 μs before the center of a single period of the carrier wave signal.

Hence, according to the sixth embodiment, the detected currents are calculated on the basis of the current values detected at the first timing when the applied voltages of the respective phases are lower than the first predetermined value or at the maximum value of the carrier wave signal, and the detected currents are calculated on the basis of the current values detected at the second timing in all other cases. In so doing, current detection values that do not include switching noise can be obtained, and as a result, it is possible to obtain a striking effect not present in the prior art, namely that vibration and noise generated by an AC rotary machine having a plurality of n-phase windings (where n is a natural number no smaller than 3) with no phase difference can be reduced.

Seventh Embodiment

In the sixth embodiment, a case in which the control device according to this invention is applied to an AC rotary machine having two sets of three-phase windings with no phase difference was described. In a seventh embodiment, on the other hand, a case in which the control device according to this invention is applied to an AC rotary machine in which a phase difference of 30 deg exists between the two sets of three-phase windings will be described. Hence, the only difference between the sixth embodiment and the seventh embodiment is the existence of the phase difference.

Figure 26:
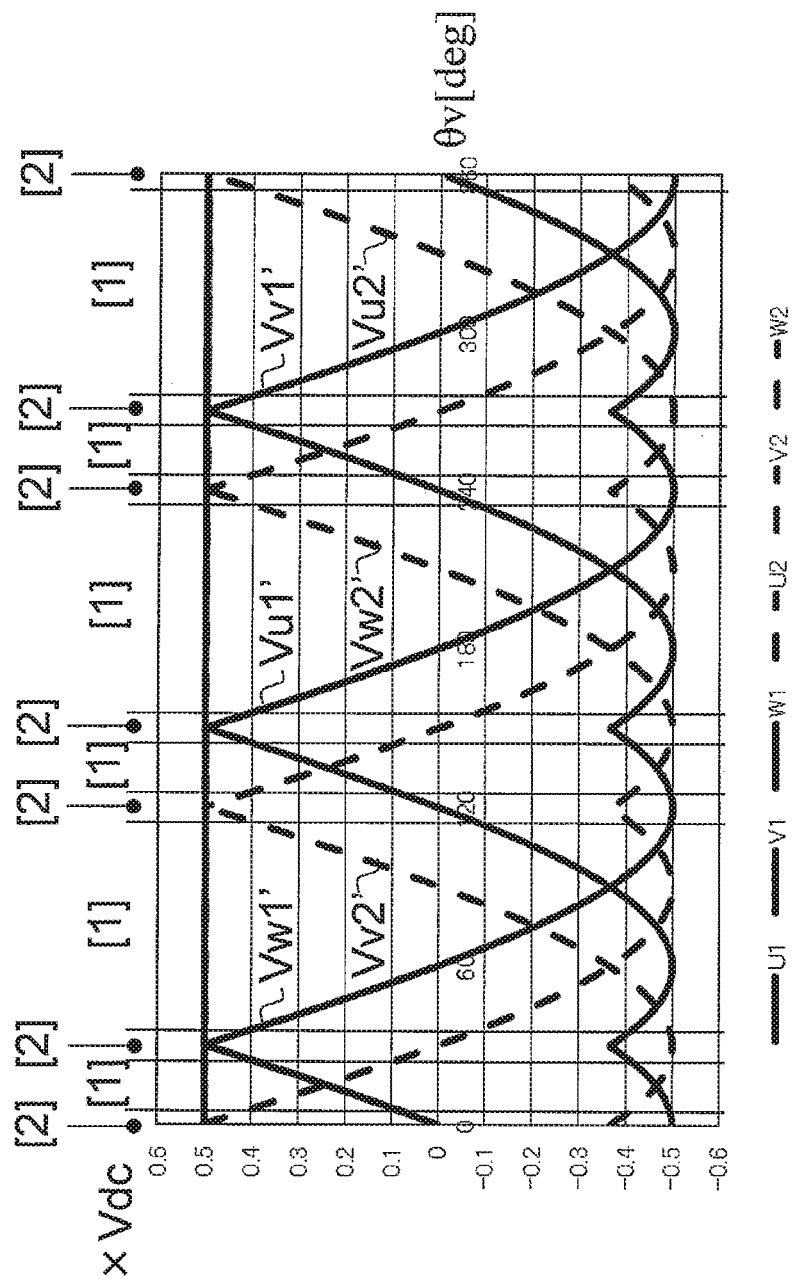
FIG. 26 is a view showing first three-phase applied voltages Vu1', Vv1', Vw1' and second three-phase applied voltages Vu2', Vv2', Vw2' according to a seventh embodiment of this invention.

FIG. 26 is a view showing the first three-phase applied voltages Vu1', Vv1', Vw1' and the second three-phase applied voltages Vu2', Vv2', Vw2' according to the seventh embodiment of this invention. In FIG. 26, [1] indicates that the detected currents are calculated used the current detection values obtained at the first timing, and [2] indicates that the detected currents are calculated using the current detection values obtained at the second timing.

Note that when the detected currents are calculated, the current detection values of two undetectable phases may be estimated from the current detection value of a single phase, as described in the second embodiment. Moreover, the current detection values obtained at the second timing may be corrected to values corresponding to the current detection values obtained at the first timing, as described in the third to fifth embodiments.

A method of setting the first timing ts1 and the second timing ts2 according to the seventh embodiment when controlling an AC rotary machine having two sets of three-phase windings with a phase difference will now be described.

Similarly to a case in which one set of windings is provided, the first timing ts1 may be set at a timing where the low potential side switching elements of the respective phases other than the first maximum phase and the second maximum phase are all switched ON when the first three-phase applied voltages and the second three-phase applied voltages are lower than the first predetermined value or at the maximum value of the carrier wave signal. For example, the first timing ts1 may be set 2.4 μs after the center of a single period of the carrier wave signal.

The second timing ts2 is to be used when the currents cannot be detected at the first timing ts1, and may therefore be set at a timing other than the timing described above where effective current detection values can be obtained. In the AC rotary machine according to the seventh embodiment, a 30 deg phase difference exists, and therefore, as shown in FIG. 26, regions where the current detection values obtained at the second timing are used exist in six locations over a single electrical angle period.

In other words, the number of electrical angle regions in which the currents can be detected at the first timing ts1 is considerably smaller than in FIG. 14 due to the effect of the phase difference between the three-phase applied voltages. Meanwhile, when the second timing is set 2.6 μs before the center of a single period of the carrier wave signal, as shown in FIG. 14, the current detection values obtained by the first current detection resistance elements 9a are not affected by switching noise generated by the first three-phase applied voltages, and since a sufficient phase difference exists, are also not affected by switching noise generated by the second three-phase applied voltages. As a result, the current detection precision does not deteriorate.

Hence, when a sufficient phase difference exists, the second timing may be set similarly to a case in which a single set of windings is provided. For example, the second timing may be set 2.6 μs before the center of a single period of the carrier wave signal.

Hence, according to the seventh embodiment, the detected currents are calculated on the basis of the current values detected at the first timing when the applied voltages of the respective phases are lower than the first predetermined value or at the maximum value of the carrier wave signal, and the detected currents are calculated on the basis of the current values detected at the second timing in all other cases. In so doing, current detection values that do not include switching noise can be obtained, and as a result, it is possible to obtain a striking effect not present in the prior art, namely that vibration and noise generated by an AC rotary machine having a plurality of n-phase windings (where n is a natural number no smaller than 3) with a phase difference can be reduced.

The invention claimed is:

1. A control device for an AC rotary machine, comprising:
a DC power supply that outputs a DC voltage;
the AC rotary machine having m sets of n-phase windings, where m is a natural number and n is a natural number no smaller than 3;
a current detector that detects respective current values of the m sets of n-phase windings;
a power converter that includes high potential side switching elements and low potential side switching elements, converts the DC voltage into an AC voltage in response to switching control implemented on the high potential side switching elements and the low potential side switching elements on the basis of ON/OFF signals, and applies the AC voltage to the windings; and
a control unit that calculates voltage commands on the basis of respective differences between a current command for the AC rotary machine and current detection values obtained by the current detector, and outputs the ON/OFF signals to the high potential side switching elements and the low potential side switching elements of the power converter by comparing applied voltages calculated on the basis of the voltage commands with a carrier wave signal,
wherein the current detector, when detecting currents flowing through the n-phase windings on the basis of currents flowing through current detection resistance elements that are inserted in series into the low potential side switching elements provided in the power converter for at least (n−1) phases, detects the currents at two or more fixed timings over a single period of the carrier wave signal to obtain current detection values that do not include errors caused by switching noise, and
wherein, the single period of the carrier wave signal comprises a start time t1, a finish time t3, and a middle time t2, and reaches a minimum value at each of the start time t1 and the finish time t3, and reaches a maximum value at the middle time t2, and
wherein, in a first condition where the n-phase voltages of the applied voltages in each of the m sets are respectively lower than a first predetermined value or equal to a maximum value of the carrier wave signal, the current detector calculates detected currents on the basis of current detection values obtained at a first timing where at least the low potential side switching elements of respective phases other than the phase having a maximum voltage command are all switched ON, and in a condition other than the first condition, the current detector calculates the detected currents on the basis of current detection values obtained at a second timing that is different to the first timing where at least the low potential side switching element of the phase having a minimum voltage command is switched ON.

2. The control device for the AC rotary machine according to claim 1, wherein, with respect to the applied voltages determined by calculation for each of the n phases of the m sets, the power converter implements an offset correction on the applied voltages by shifting all of the voltage commands equally so that an applied voltage calculated in relation to a voltage command of a maximum phase equals a maximum value of the carrier wave signal.

3. The control device for then AC rotary machine according to claim 1, further comprising an angle detector that detects an angle of the AC rotary machine,
wherein, when a current of at least one phase of then phases in each of the m sets is detectable and currents of at most (n−1) phases are undetectable at a present current detection timing, the current detector estimates the currents of the (n−1) phases that are undetectable at the present current detection timing by calculation on the basis of detected currents of n phases obtained at a past current detection timing, the detected current of the single phase that is detectable at the present current detection timing, and an angle variation amount, which is a difference between the angle of the AC rotary, machine detected by the angle detector at the past current detection timing and the angle of the AC rotary machine at the present current detection timing.

4. The control device for the AC rotary machine according to claim 1, wherein the current detector:
corrects the current detection values obtained at the first timing to current detection values obtained at a reference timing on the basis of a first coefficient that is proportional to a time difference between the reference timing and the first timing; and
corrects the current detection values obtained at the second timing to the current detection values obtained at the reference timing on the basis of a second coefficient that is proportional to a time difference between the reference timing and the second timing.

5. The control device for the AC rotary machine according to claim 4, wherein, when at least two phases are detectable at both the first timing and the second timing, the current detector calculates a ratio of the first coefficient to the second coefficient using a ratio of the current detection values of the respective phases, and corrects at least one of the set of current detection values obtained at the first timing and the set of current detection values obtained at the second timing to the current detection values obtained at the reference timing.

6. The control device for the AC rotary machine according to claim 5, wherein the current detector calculates the ratio of the first coefficient to the second coefficient using a ratio of current detection values of phases having a maximum amplitude, among detectable phases.

7. The control device for the AC rotary machine according to claim 4, wherein the current detector sets the first timing as the reference timing, leaves the current detection values obtained at the first timing uncorrected, and corrects the current detection values obtained at the second timing to the current detection values obtained at the first timing.

8. The control device for the AC rotary machine according to claim 4, wherein the current detector sets the first timing as the reference timing, and when a current detection value of a phase that was detectable at both the first timing and the second timing at a past timing is undetectable at the first timing but detectable at the second timing at a present timing, corrects the current detection value obtained at the second timing of the present timing to the current detection value obtained at the first timing of the present timing by adding a value obtained by subtracting the current detection value obtained at the second timing of the past timing from the current detection value obtained at the first timing of the past timing to the current detection value obtained at the second timing of the present timing.

9. A control device for the electric power steering, comprising the control device for an AC rotary machine according to claim 1, wherein the control unit calculates the voltage commands such that the AC rotary machine generates torque for assisting steering torque generated by a steering system.

* * * * *